(12) United States Patent
Rathburn

(10) Patent No.: US 6,957,963 B2
(45) Date of Patent: Oct. 25, 2005

(54) COMPLIANT INTERCONNECT ASSEMBLY

(75) Inventor: James J. Rathburn, Greenfield, MN (US)

(73) Assignee: Gryphics, Inc., Plymouth, MN (US)

(*) Notice: Subject to any disclaimer, the term of this patent is extended or adjusted under 35 U.S.C. 154(b) by 0 days.

(21) Appl. No.: 10/453,322

(22) Filed: Jun. 3, 2003

(65) Prior Publication Data

US 2004/0029411 A1 Feb. 12, 2004

Related U.S. Application Data

(63) Continuation-in-part of application No. 10/169,481, filed as application No. PCT/US01/00872 on Jan. 11, 2001.
(60) Provisional application No. 60/177,112, filed on Jan. 20, 2000.

(51) Int. Cl.⁷ .............................................. H01R 12/00
(52) U.S. Cl. ............................ 439/66; 439/91; 439/85; 439/260; 439/329; 439/492; 439/591
(58) Field of Search ........................ 439/66–69, 85, 439/91, 329, 429–494, 591–592

(56) References Cited

U.S. PATENT DOCUMENTS

| | | | |
|---|---|---|---|
| 2,958,064 A | 10/1960 | Swengel | |
| 3,880,486 A | 4/1975 | Avakian | |
| 3,904,934 A | 9/1975 | Martin | |
| 3,964,813 A | 6/1976 | Pizzeck | |

(Continued)

FOREIGN PATENT DOCUMENTS

| | | |
|---|---|---|
| EP | 0 351 851 A2 | 1/1990 |
| EP | 0 351 851 A3 | 1/1990 |
| EP | 0 405 333 A2 | 1/1991 |
| EP | 0 431 566 A1 | 6/1991 |
| EP | 0 571 879 | 12/1993 |
| EP | 0 574 793 A1 | 12/1993 |
| EP | 0 574 793 A1 B1 | 12/1993 |
| EP | 0 310 302 A3 | 10/1994 |
| EP | 0 310 302 B1 | 10/1994 |
| EP | 0 817 319 A2 | 1/1998 |
| GB | 1 488 328 | 10/1977 |
| GB | 2 027 560 A | 2/1980 |
| GB | 2274212 | 7/1994 |
| WO | WO 98/13695 | 4/1998 |
| WO | 98/13695 | 4/1998 |
| WO | WO 98/50985 | 11/1998 |
| WO | 98/50985 | 11/1998 |
| WO | WO 00/46885 | 8/2000 |
| WO | 00/46885 | 8/2000 |
| WO | WO 01/09980 A3 | 2/2001 |
| WO | WO 01/09980 A2 | 2/2001 |
| WO | 01/09980 A2 | 2/2001 |
| WO | 01/09980 A3 | 2/2001 |
| WO | 01/54232 A2 | 7/2001 |
| WO | WO 01/54232 A2 | 7/2001 |

OTHER PUBLICATIONS

"Silicon Contact Technology for Test and Burn–In of FBGA Packages", Bear Technology, Inc. Rev, 9/97, pp. 1–12 (1997).

\* cited by examiner

*Primary Examiner*—Truc T. T. Nguyen
(74) *Attorney, Agent, or Firm*—Faegre & Benson LLP

(57) ABSTRACT

An apparatus and method for making a compliant interconnect assembly. The compliant interconnect assembly includes a first carrier having a first major surface and a plurality of through openings. A first major surface of a first flexible circuit member having a plurality of electrical traces is attached to the first major surface of the first carrier. The electrical traces include a plurality of compliant members having at least one distal end projecting in one of the openings of the first carrier. A first major surface of a second carrier is positioned opposite a second major surface of the first flexible circuit member. The second carrier has a plurality of through openings aligned with the plurality of the compliant members.

47 Claims, 26 Drawing Sheets

U.S. PATENT DOCUMENTS

| | | | |
|---|---|---|---|
| 4,118,090 A | 10/1978 | Del Mei | |
| 4,161,346 A | 7/1979 | Cherian et al. | |
| 4,165,909 A | 8/1979 | Yeager et al. | |
| 4,189,200 A | 2/1980 | Yeager et al. | |
| 4,445,735 A | 5/1984 | Bonnefoy | |
| 4,468,074 A | 8/1984 | Gordon | |
| 4,498,722 A | 2/1985 | Fedder et al. | |
| 4,509,099 A | 4/1985 | Takamatsu et al. | |
| 4,528,500 A | 7/1985 | Lightbody et al. | |
| 4,548,451 A | 10/1985 | Benarr et al. | |
| 4,575,170 A | 3/1986 | Gurley | |
| 4,579,411 A | 4/1986 | Cobaugh et al. | |
| 4,593,961 A | 6/1986 | Cosmo | |
| 4,603,928 A | 8/1986 | Evans | |
| 4,610,495 A | 9/1986 | Landi | |
| 4,629,270 A | 12/1986 | Andrews, Jr. et al. | |
| 4,648,668 A | 3/1987 | Sinisi | |
| 4,655,524 A | 4/1987 | Etzel | |
| 4,691,972 A | 9/1987 | Gordon | |
| 4,700,132 A | 10/1987 | Yarbrough et al. | |
| 4,758,176 A | 7/1988 | Abe et al. | |
| 4,768,971 A | 9/1988 | Simpson | |
| 4,789,345 A | 12/1988 | Carter | |
| 4,793,814 A | 12/1988 | Zifcak et al. | |
| 4,872,853 A | 10/1989 | Webster | |
| 4,904,197 A | 2/1990 | Cabourne | |
| 4,913,656 A | 4/1990 | Gordon et al. | |
| 4,927,369 A | 5/1990 | Grabbe et al. | |
| 4,954,878 A | 9/1990 | Fox et al. | |
| 4,976,626 A | 12/1990 | Dibble et al. | |
| 5,007,842 A | 4/1991 | Deak et al. | |
| 5,049,084 A | 9/1991 | Bakke | |
| 5,061,192 A | 10/1991 | Chapin et al. | |
| 5,071,359 A | 12/1991 | Arnio et al. | |
| 5,096,426 A | 3/1992 | Simpson et al. | |
| 5,099,393 A | 3/1992 | Bentlage et al. | |
| 5,152,695 A | 10/1992 | Grabbe et al. | |
| 5,156,553 A | 10/1992 | Katsumata et al. | |
| 5,163,834 A | 11/1992 | Chapin et al. | |
| 5,167,512 A | 12/1992 | Walkup | |
| 5,173,055 A | 12/1992 | Grabbe | |
| 5,199,889 A | 4/1993 | McDevitt, Jr. | |
| 5,203,075 A | 4/1993 | Angulas et al. | |
| 5,207,585 A | 5/1993 | Byrnes et al. | |
| 5,227,959 A | 7/1993 | Rubinstein et al. | |
| 5,252,916 A | 10/1993 | Swart | |
| 5,299,090 A | 3/1994 | Brady et al. | |
| 5,321,884 A | 6/1994 | Ameen et al. | |
| 5,324,205 A | 6/1994 | Ahmad et al. | |
| 5,338,207 A | 8/1994 | Lineberry et al. | |
| 5,342,205 A | 8/1994 | Hashiguchi | |
| 5,358,412 A | 10/1994 | Maurinus et al. | |
| 5,388,998 A | 2/1995 | Grange et al. | |
| 5,395,252 A | 3/1995 | White | |
| 5,410,260 A | 4/1995 | Kazama | |
| 5,412,329 A | 5/1995 | Iino et al. | |
| 5,427,535 A | 6/1995 | Sinclair | |
| 5,437,556 A | 8/1995 | Bargain et al. | |
| 5,519,331 A | 5/1996 | Cowart et al. | |
| 5,521,519 A | 5/1996 | Faure et al. | |
| 5,548,488 A | 8/1996 | Hansen | |
| 5,637,539 A | 6/1997 | Hofmann et al. | |
| 5,645,433 A | 7/1997 | Johnson | |
| 5,652,608 A | 7/1997 | Watanabe et al. | |
| 5,653,598 A | 8/1997 | Grabbe | |
| 5,706,174 A | 1/1998 | Distefano et al. | |
| 5,723,347 A | 3/1998 | Hirano et al. | |
| 5,772,451 A | 6/1998 | Dozier, II et al. | |
| 5,795,172 A | 8/1998 | Shahriari et al. | |
| 5,829,988 A | 11/1998 | McMillan et al. | |
| 5,913,687 A | 6/1999 | Rathburn | |
| 5,920,765 A | 7/1999 | Naum et al. | |
| 5,923,178 A | 7/1999 | Higgins et al. | |
| 5,938,451 A | 8/1999 | Rathburn | |
| 5,947,749 A | 9/1999 | Rathburn | |
| 5,984,691 A | 11/1999 | Brodsky et al. | |
| 6,079,987 A | 6/2000 | Matsunaga et al. | |
| 6,094,115 A | 7/2000 | Nguyen et al. | |
| 6,135,783 A | 10/2000 | Rathburn | |
| 6,174,174 B1 * | 1/2001 | Suzuki et al. | 439/71 |
| 6,178,629 B1 | 1/2001 | Rathburn | |
| 6,210,173 B1 * | 4/2001 | Matsunaga | 439/66 |
| 6,231,353 B1 | 5/2001 | Rathburn | |
| 6,247,938 B1 | 6/2001 | Rathburn | |
| 6,294,920 B1 | 9/2001 | Pfaff | |
| 6,312,266 B1 | 11/2001 | Fan et al. | |
| 6,379,176 B1 | 4/2002 | Ohsawa et al. | |
| 6,384,475 B1 * | 5/2002 | Beroz et al. | 257/690 |
| 6,409,521 B1 | 6/2002 | Rathburn | |
| 6,450,821 B2 | 9/2002 | Otsuki et al. | |
| 6,663,399 B2 | 12/2003 | Ali et al. | |
| 6,695,623 B2 | 2/2004 | Brodsky et al. | |

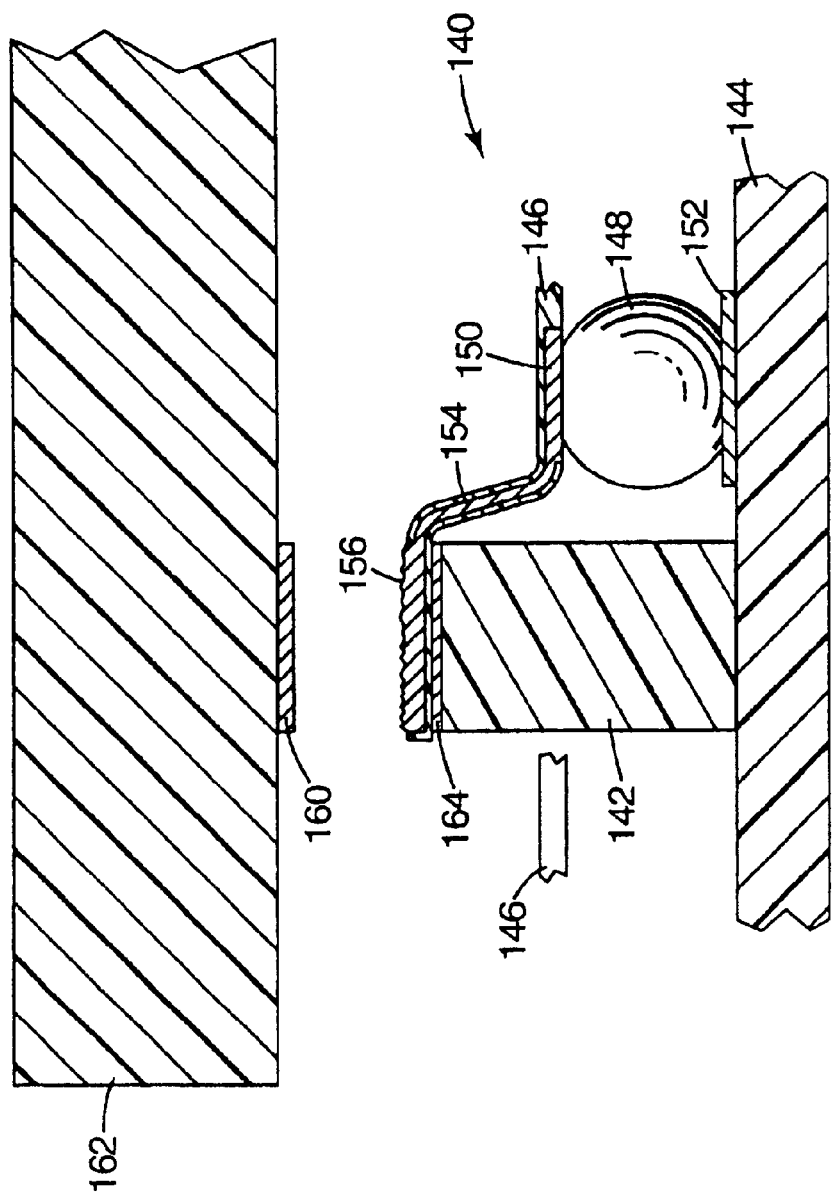

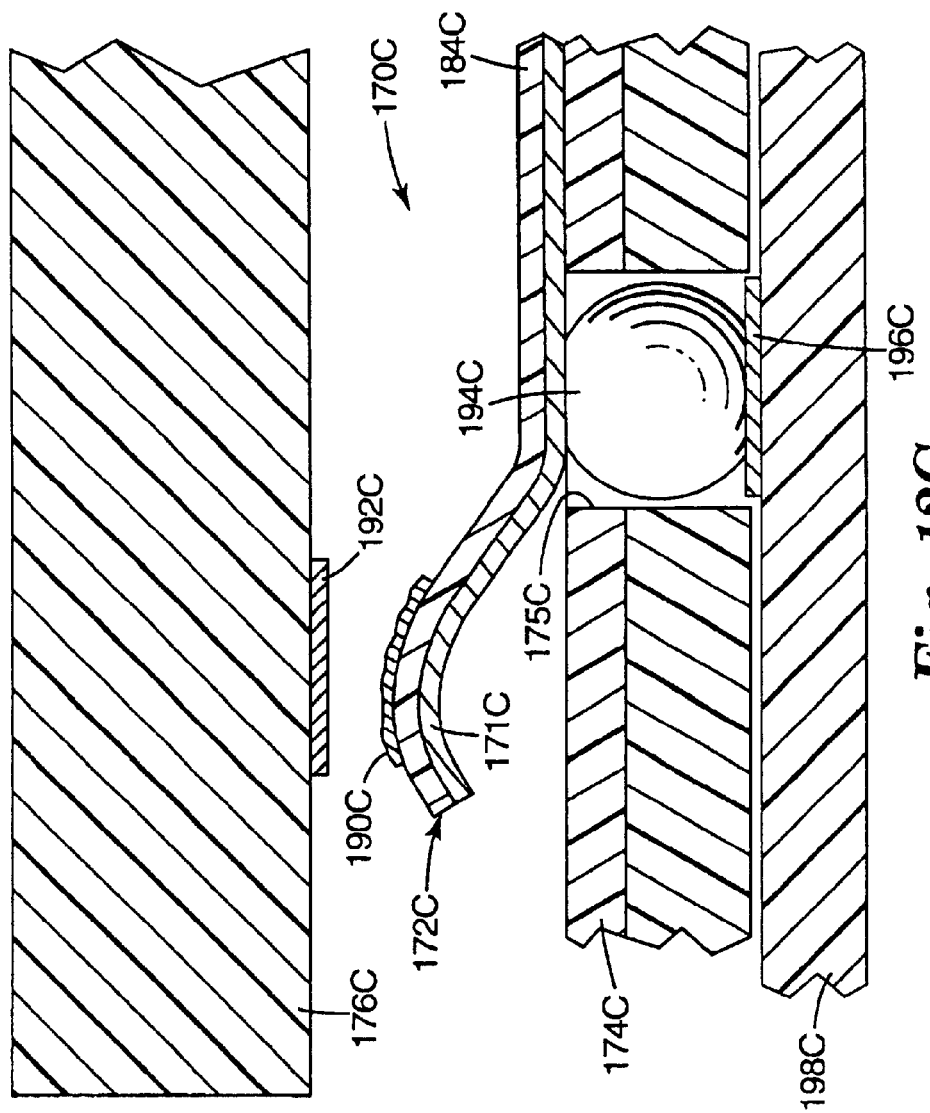

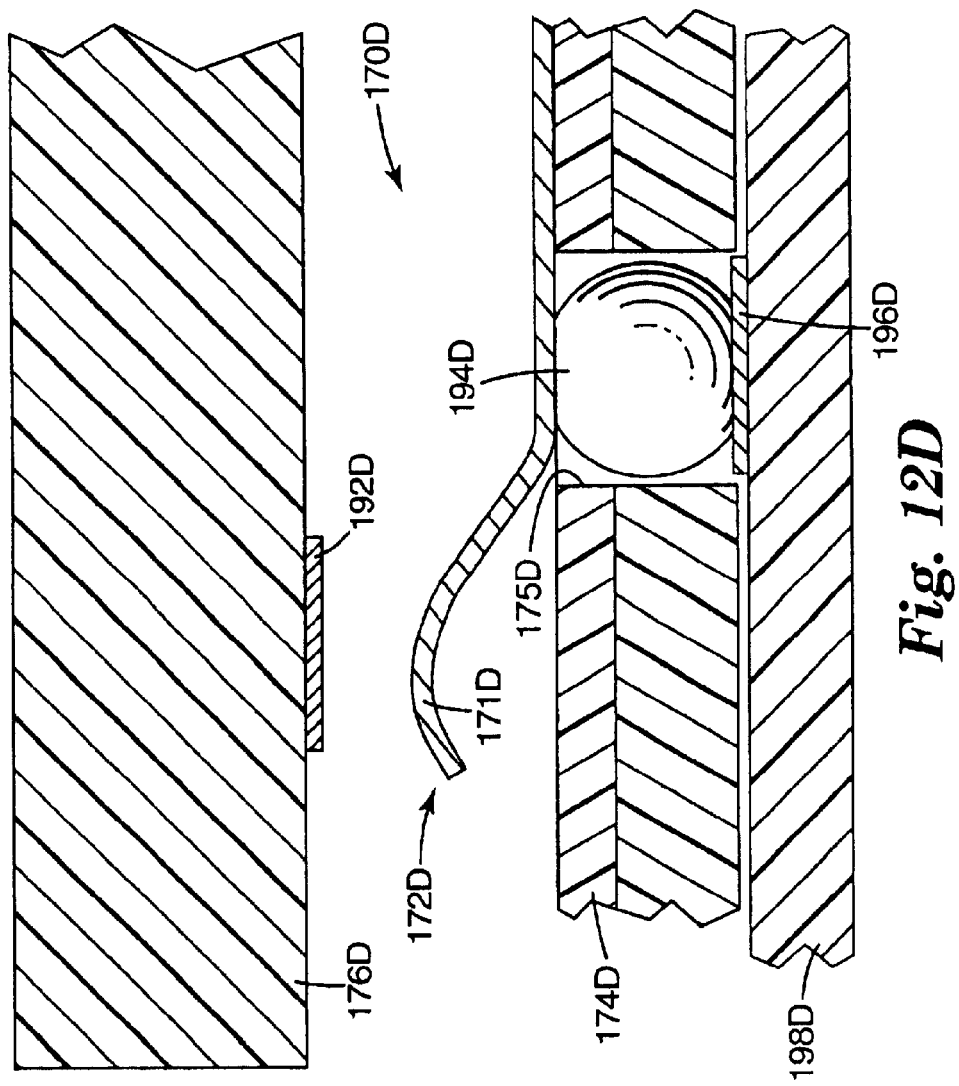

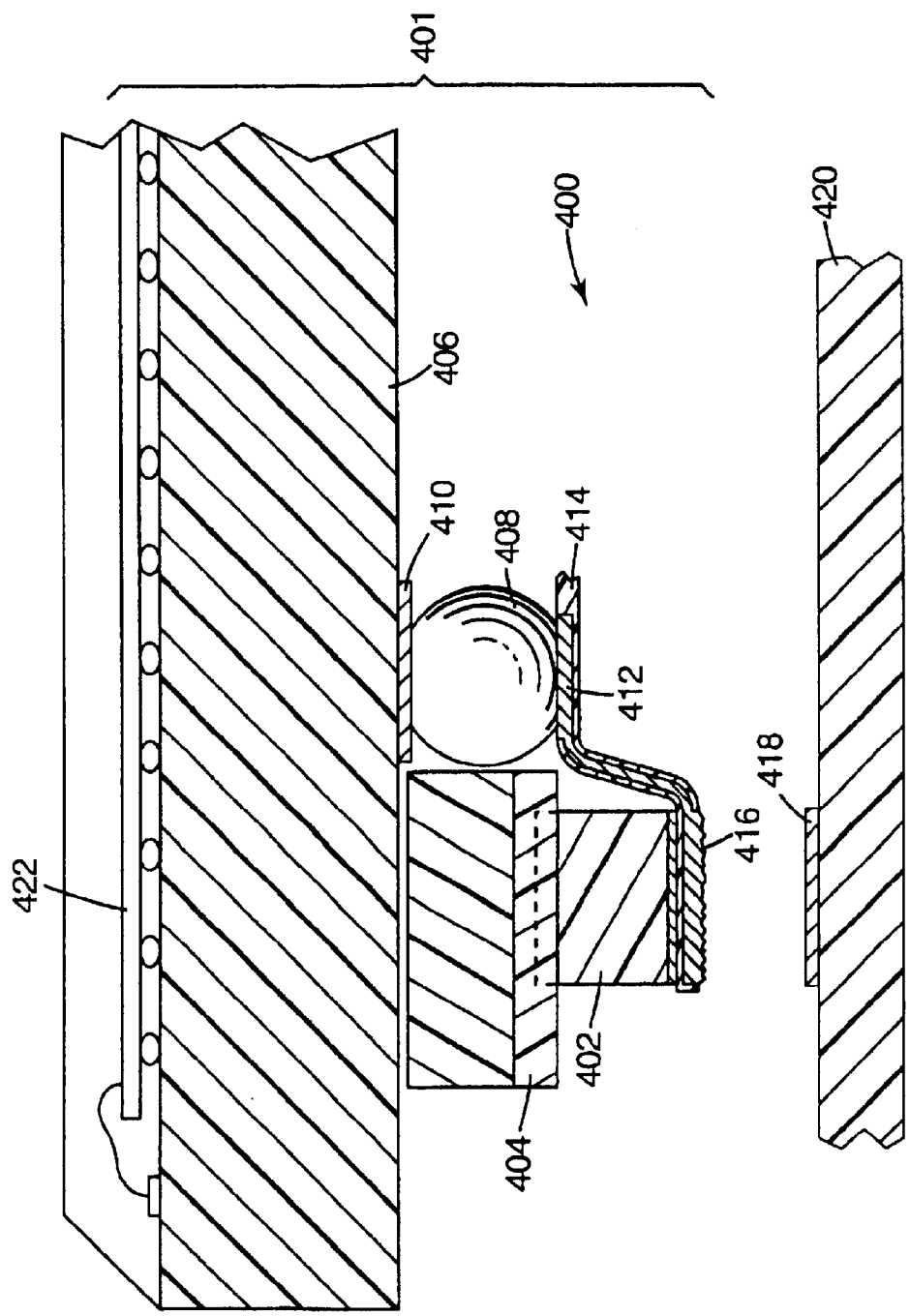

COMPLIANT INTERCONNECT ASSEMBLY

REFERENCE TO RELATED APPLICATION

This application is a continuation-in-part application of U.S. patent application Ser. No. 10/169,431 filed Jun. 26, 2002 entitled "Flexible Compliant Interconnect Assembly", which claims priority to PCT/US01/00872 filed Jan. 11, 2001, which claims the benefit of U.S. provisional application Ser. No. 60/177,112 filed Jan. 20, 2000, all of which are hereby incorporated by reference.

FIELD OF THE INVENTION

The present invention is directed to a method and apparatus for achieving a compliant, solderless or soldered interconnect between circuit members.

BACKGROUND OF THE INVENTION

The current trend in connector design for those connectors utilized in the computer field is to provide both high density and high reliability connectors between various circuit devices. High reliability for such connections is essential due to potential system failure caused by misconnection of devices. Further, to assure effective repair, upgrade, testing and/or replacement of various components, such as connectors, cards, chips, boards, and modules, it is highly desirable that such connections be separable and reconnectable in the final product.

Pin-type connectors soldered into plated through holes or vias are among the most commonly used in the industry today. Pins on the connector body are inserted through plated holes or vias on a printed circuit board and soldered in place using conventional means. Another connector or a packaged semiconductor device is then inserted and retained by the connector body by mechanical interference or friction. The tin lead alloy solder and associated chemicals used throughout the process of soldering these connectors to the printed circuit board have come under increased scrutiny due to their environmental impact. Additionally, the plastic housings of these connectors undergo a significant amount of thermal activity during the soldering process, which stresses the component and threatens reliability.

The soldered contacts on the connector body are typically the means of supporting the device being interfaced by the connector and are subject to fatigue, stress deformation, solder bridging, and co-planarity errors, potentially causing premature failure or loss of continuity. In particular, as the mating connector or semiconductor device is inserted and removed from the present connector, the elastic limit on the contacts soldered to the circuit board may be exceeded causing a loss of continuity. These connectors are typically not reliable for more than a few insertions and removals of devices. These devices also have a relatively long electrical length that can degrade system performance, especially for high frequency or low power components. The pitch or separation between adjacent device leads that can be produced using these connectors is also limited due to the risk of shorting.

Another electrical interconnection method is known as wire bonding, which involves the mechanical or thermal compression of a soft metal wire, such as gold, from one circuit to another. Such bonding, however, does not lend itself readily to high-density connections because of possible wire breakage and accompanying mechanical difficulties in wire handling.

An alternate electrical interconnection technique involves placement of solder balls or the like between respective circuit elements. The solder is reflown to form the electrical interconnection. While this technique has proven successful in providing high-density interconnections for various structures, this technique does not facilitate separation and subsequent reconnection of the circuit members.

An elastomeric material having a plurality of conductive paths has also been used as an interconnection device. The conductive elements embedded in the elastomeric sheet provide an electrical connection between two opposing terminals brought into contact with the elastomeric sheet. The elastomeric material must be compressed to achieve and maintain an electrical connection, requiring a relatively high force per contact to achieve adequate electrical connection, exacerbating non-planarity between mating surfaces. Location of the conductive elements is generally not controllable. Elastomeric connectors may also exhibit a relatively high electrical resistance through the interconnection between the associated circuit elements. The interconnection with the circuit elements can be sensitive to dust, debris, oxidation, temperature fluctuations, vibration, and other environmental elements that may adversely affect the connection.

The problems associated with connector design are multiplied when multiple integrated circuit devices are packaged together in functional groups. The traditional way is to solder the components to a printed circuit board, flex circuit, or ceramic substrate in either a bare die silicon integrated circuit form or packaged form. Multi-chip modules, ball grids, array packaging, and chip scale packaging have evolved to allow multiple integrated circuit devices to be interconnected in a group.

One of the major issues regarding these technologies is the difficulty in soldering the components, while ensuring that reject conditions do not exist. Many of these devices rely on balls of solder attached to the underside of the integrated circuit device which is then reflown to connect with surface mount pads of the printed circuit board, flex circuit, or ceramic substrate. In some circumstances, these joints are generally not very reliable or easy to inspect for defects. The process to remove and repair a damaged or defective device is costly and many times results in unusable electronic components and damage to other components in the functional group.

Many of the problems encountered with connecting integrated circuit devices to larger circuit assemblies are compounded in multi-chip modules. Multi-chip modules have had slow acceptance in the industry due to the lack of large scale known good die for integrated circuits that have been tested and burned-in at the silicon level. These dies are then mounted to a substrate, which interconnect several components. As the number of devices increases, the probability of failure increases dramatically. With the chance of one device failing in some way and effective means of repairing or replacing currently unavailable, yield rates have been low and the manufacturing costs high.

BRIEF SUMMARY OF THE INVENTION

The present invention is directed to a method and apparatus for achieving a fine pitch interconnect between circuit members. The connection with the circuit members can be soldered or solderless. The circuit members can be printed circuit boards, another flexible circuit, a bare-die device, an integrated circuit device, an organic or inorganic substrate, a rigid circuit and virtually any other type of electrical component. The present invention is also directed to an electrical interconnect assembly comprising one or more flexible circuit members electrically coupled to a plurality of circuit members.

In one embodiment, the compliant interconnect assembly includes a first carrier having a first major surface and a plurality of through openings. A first major surface of a first flexible circuit member having a plurality of electrical traces is attached to the first major surface of the first carrier. The electrical traces comprise a plurality of compliant members having at least one distal end projecting in one of the openings of the first carrier. A first major surface of a second carrier is positioned opposite a second major surface of the first flexible circuit member. The second carrier has a plurality of through openings aligned with the plurality of the compliant members. The carrier can be a rigid, semi-rigid or flexible material.

The distal ends are preferably deformed to project through an opening in the first carrier. In some embodiments, the distal end is deformed to extend through an opening in the first carrier and to extend above a second major surface of the first carrier. Each compliant member can have one or more distal ends. For example, a single compliant member can have a first distal end deformed to project in an opening in the first carrier and a second distal end deformed to project in an opening in the second carrier. It is also possible for solder balls to be located in the openings in the second carrier and electrically coupled with the compliant members.

A first circuit member having contact pads is aligned with, and electrically coupled to, the distal ends of the compliant members. The first circuit member can be a printed circuit board, a flexible circuit, a bare die device, an integrated circuit device, organic or inorganic substrates, or a rigid circuit. A second circuit member having contact pads is aligned with the holes in the second carrier. For example, the second circuit member is electrically coupled to the compliant members through the holes in the second carrier using solder.

An additional circuitry plane can be attached to a second major surface of the second carrier. The additional circuitry plane includes a plurality of through openings aligned with the plurality of openings in the second carrier. The additional circuitry plane can be one of a ground plane, a power plane, or an electrical connection to other circuit members. In another embodiment, one or more discrete electrical components, such as capacitors, can be electrically coupled to the first flexible circuit member.

In some embodiments a second flexible circuit member is attached to the first major surface of the second carrier. The electrical traces include a plurality of compliant members having at least one distal end projecting in one of the openings of the second carrier. An electrical connection is formed between the compliant members on the first flexible circuit member and the compliant members on the second flexible circuit member. Optional dielectric layers can be located between the first and second flexible circuit members. The electrical connection can be formed using solder, a conductive plug, compression, conductive adhesive, or a variety of other mechanisms. In another embodiment, the second carrier is attached to a printed circuit board and the compliant members are electrically coupled to contact pads on the printed circuit board through the openings in the second carrier.

In one embodiment, a portion of the first flexible circuit member extends beyond the compliant interconnect assembly to permit electrical coupling with another circuit member. A portion of the first flexible circuit member can extend beyond the compliant interconnect assembly to form a stacked configuration other compliant interconnect assemblies.

In another embodiment, the compliant interconnect assembly includes a first carrier having a first major surface and a plurality of through openings. At least one discrete compliant member extends through an opening in the first carrier and is attached to the first carrier adjacent to the openings. The compliant member has at least one distal end projecting away from the first carrier. A second carrier having a first major surface is positioned opposite the first major surface of the first carrier. The second carrier has a plurality of openings through which the distal ends of the compliant members extend.

The compliant interconnect assembly can include a plurality of electrical traces attached to the first major surface of the first carrier. The electrical traces comprises a plurality of compliant members having at least one distal end projecting in one of the openings of the first carrier. The compliant members can have two distal ends projecting away from opposite sides of the first carrier. Alternatively, solder balls can be electrically coupled to the compliant members so as to project away from a second major surface of the first carrier.

The present invention is also directed to a method of making a compliant interconnect assembly. A first major surface of a first flexible circuit member is attached to the first major surface of the first carrier so that distal ends of compliant members project in one of the openings in the first carrier. The first flexible circuit member is singulated so that a portion of the compliant members are electrically isolated from the electrical traces. A second carrier is positioned opposite a second major surface of the first flexible circuit member so that the through openings in the second carrier are aligned with compliant members.

In one embodiment, an additional circuitry plane is attached to a second major surface of the second carrier. The additional circuitry plane comprises a plurality of through openings aligned with a plurality through openings in the second carrier. The additional circuitry plane can be a ground plane, a power plane, or an electrical connection to other circuit members. Selected compliant members can be electrically coupled to the additional circuitry plane. One or more discrete electrical components, such as capacitors, can be attached to the first flexible circuit member.

BRIEF DESCRIPTION OF THE DRAWINGS

FIG. 3 is a side sectional view of a method of modifying the electrical interconnect of FIG. 2.

FIG. 4 is a side sectional view of an electrical contact modified in accordance with the method of the present invention.

FIG. 11 is a side sectional view of a compliant interconnect assembly in accordance with the present invention.

FIG. 12C is a side sectional view of an alternate compliant interconnect assembly with a sheet of spring members in accordance with the present invention.

FIG. 12D is a side sectional view of an alternate compliant interconnect assembly using one of the flexible circuit members of FIGS. 10D-10I.

FIG. 15A is a side sectional view of a compliant interconnect assembly with a carrier and an integrated circuit device in accordance with the present invention.

DETAILED DESCRIPTION OF THE INVENTION

Figure 4:
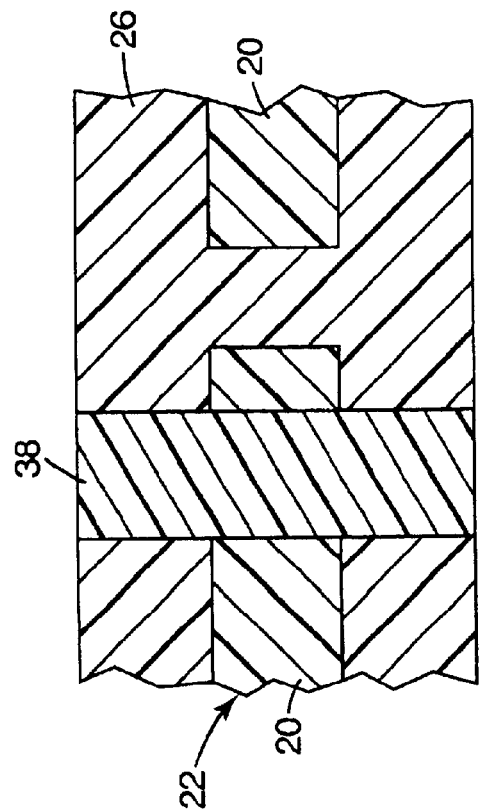
FIG. 4 is a side sectional view of a compliant material applied to the substrate of FIG. 3.
Figure 1:
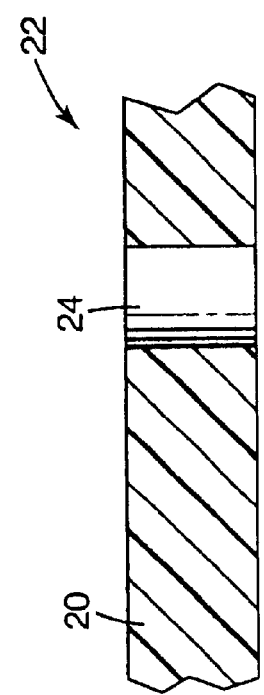
FIG. 1 is a substrate used for making a compliant interconnect in accordance with the present invention.
Figure 5:
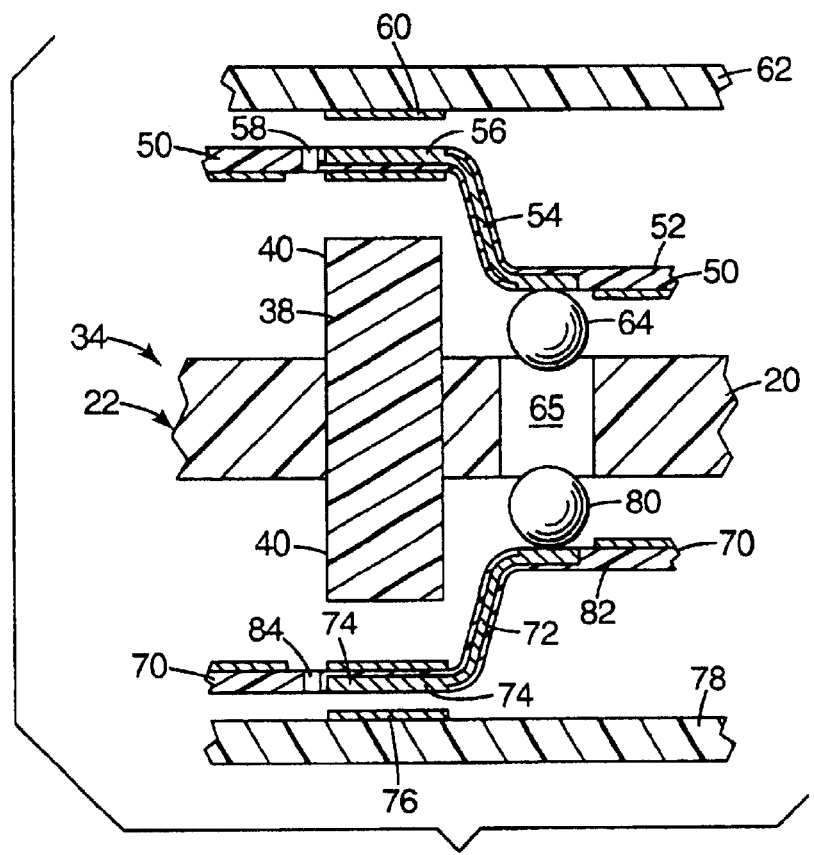
FIG. 5 is a side sectional view of a compliant interconnect assembly in accordance with the present invention.

FIGS. 1-4 illustrate a method of preparing a compliant interconnect 22 in accordance with the present invention (see FIG. 5). The Figures disclosed herein may or may not be drawn to scale. The substrate 20 is perforated to include one or more through holes 24. The holes 24 can be formed by a variety of techniques, such as molding, stamping, laser drilling, or mechanical drilling. The holes 24 can be arranged in a variety of configurations, including one or two-dimensional arrays. As will be discussed below, some embodiments do not require the holes 24. The substrate 20 is typically constructed from a dielectric material, such as plastics, ceramic, or metal with a non-conductive coating. In some of the embodiments discussed below, an electrically active circuit member (see FIG. 11) is substituted for the electrically inactive substrate 20.

Figure 2:
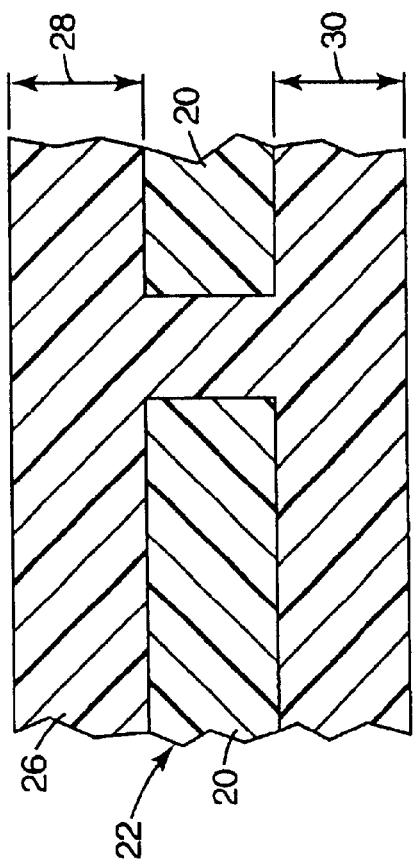
FIG. 2 is a side sectional of the substrate of FIG. 1 with a masking material applied in accordance with the present invention.
Figure 3:
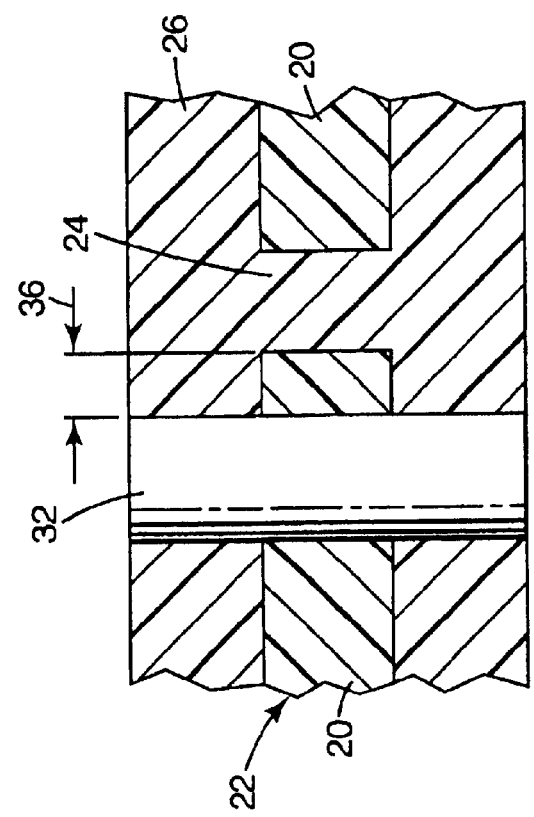
FIG. 3 is a side sectional view of the substrate and masking material of FIG. 2 with an additional hole in accordance with the present invention.

As illustrated in FIG. 2, the substrate 20 is then flooded with one or more masking materials 26, such as a solder mask or other materials. Through careful application and/or subsequent processing, such as planarization, the thickness of the masking material at locations 28, 30 is closely controlled for reasons that will become clearer below. The additional holes 32 shown in FIG. 3 are then drilled or perforated in the substrate 20 and masking material 24 at a predetermined distance 36 from the existing through hole 24. While there is typically a hole 32 adjacent each of the holes 24, there is not necessarily a one-to-one correlation. The holes 32 can be arranged in a variety of configurations, which may or may not correlate to the one or two-dimensional array of holes 24.

The holes 32 are then filled with a compliant material 38, as shown in FIG. 4. The thickness of the compliant material 38 is typically determined by the thickness of the masking material 26. Suitable compliant materials include elastomeric materials such as Sylgard™ available from Dow Corning Silicone of Midland, Mich. and MasterSyl '713, available from Master Bond Silicone of Hackensack, N.J.

The compliant interconnect 22 of FIGS. 2-4 can optionally be subjected to a precision grinding operation, which results in very flat surfaces, typically within about 0.0005 inches. The grinding operation can be performed on both sides at the same time using a lapping or double grinding process. In an alternate embodiment, only one surface of the compliant interconnect 22 is subject to the planarization operation. The present method permits the accurate manufacture of raised portions 40 having virtually any height.

Once the compliant encapsulant 38 is cured, the masking material 26 is removed to yield the compliant interconnect 22 illustrated in FIG. 5. The compliant interconnect 22 illustrated in FIG. 5 includes the substrate 20, one or more compliant raised portions 40 of the compliant encapsulant 38 extending above the substrate 20, and the through holes 24. The compliant raised portions can be, for example, the non-conductive encapsulant 38 in FIG. 5 or the conductive member 171C of FIG. 12C. The substrate can be a carrier or a circuit member, such as a printed circuit board, a flexible circuit, a bare die device, an integrated circuit device, organic or inorganic substrates, or a rigid circuit. The through holes are optionally added for some applications.

FIG. 5 illustrates a compliant interconnect assembly 34 in accordance with the present invention. The compliant interconnect assembly 34 includes the compliant interconnect 22 and one or more flexible circuit members 50, 70. The first flexible circuit member 50 is located along one surface of the compliant interconnect 22. The first flexible circuit member 50 includes a polymeric sheet 52 and a series of electrical traces 54. In the embodiment illustrated in FIG. 5, the traces 54 terminate at a contact pad 56. The electrical trace 54 terminates in a solder ball 64. The contact pad 56 is positioned to engage with a contact pad 60 on a first circuit member 62. The solder ball 64 is positioned adjacent to through hole 65. As used herein, "circuit member" refers to a printed circuit board, a flexible circuit, a packaged or unpackaged bare die silicon device, an integrated circuit device, organic or inorganic substrates, a rigid circuit, or a carrier (discussed below).

The region of the polymeric sheet 52 adjacent to the contact pad 56 includes singulation 58. The singulation 58 is a complete or partial separation of the terminal from the sheet 52 that does not disrupt the electrical integrity of the conductive trace 54. In the illustrated embodiment, the singulation 58 is a slit surrounding a portion of the contact pad 56. The slit may be located adjacent to the perimeter of the contact pad 56 or offset therefrom. The singulated flexible circuit members 50, 70 control the amount of force, the range of motion, and assist with creating a more evenly distributed force vs. deflection profile across the array.

As used herein, a singulation can be a complete or partial separation or a perforation in the polymeric sheet and/or the electrical traces. Alternatively, singulation may include a thinning or location of weakness of the polymeric sheet along the edge of, or directly behind, the contact pad. The singulation releases or separates the contact pad from the polymeric sheet, while maintaining the interconnecting circuit traces.

The singulations can be formed at the time of manufacture of the polymeric sheet or can be subsequently patterned by mechanical methods such as stamping or cutting, chemical methods such as photolithography, electrical methods such as excess current to break a connection, a laser, or a variety of other techniques. In one embodiment, a laser system, such as Excimer, $CO_2$, or YAG, creates the singulation. This structure is advantageous in several ways, where the force of movement is greatly reduced since the flexible circuit member is no longer a continuous membrane, but a series of flaps or bond sites with a living hinge and bonded contact (see for example FIG. 10).

The second flexible circuit member 70 is likewise positioned on the opposite side of the compliant interconnect 22. Electrical trace 72 is electrically coupled to contact pad 74 positioned to engage with a contact pad 76 on a second circuit member 78. Solder ball 80 is located on the opposite end of the electrical trace 72. Polymeric sheet 82 of the second flexible circuit member 70 also includes a singulation 84 adjacent to the contact pad 74.

The contact pads 56, 74 can be part of the base laminate of the flexible circuit members 50, 70, respectively. Alternatively, discrete contact pads 56, 74 can be formed separate from the flexible circuit members 50, 70 and subsequently laminated or bonded in place. For example, an array of contact pads 56, 74 can be formed on a separate sheet and laminated to the flexible circuit members 50, 70. The laminated contact pads 56, 74 can be subsequently processed to add structures (see FIG. 20) and/or singulated.

The contact pads 60, 76 may be a variety of structures such as, for example, a ball grid array, a land grid array, a pin grid array, contact points on a bare die device, etc. The contact pads 60, 76 can be electrically coupled with the compliant interconnect assembly 34 by compressing the components 62, 78, 34 together (solderless), by reflowing solder or solder paste at the electrical interface, by conductive adhesive at the electrical interface, or a combination thereof.

Figure 6:
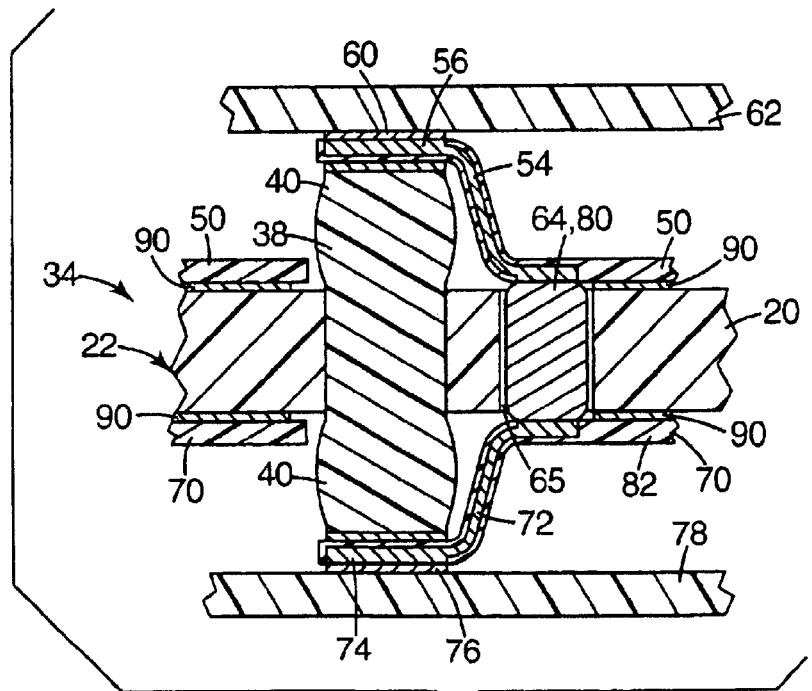
FIG. 6 is a side sectional view of the compliant interconnect assembly of FIG. 5 in a compressed state in accordance with the present invention.

As illustrated in FIG. 6, the first and second flexible circuit members 50, 70 are compressed against the compliant interconnect assembly 34. The solder balls 64, 80 are reflown and create an electrical connection between the first and second flexible circuit members 50, 70, generally within through hole 65. Adhesive 90 may optionally be used to retain the first and second flexible circuit members 50, 70 to the substrate 20. Contact pads 56, 74 are abutted against raised portion 40 of the compliant material 38.

The singulations 58, 84 permit the raised portions 40 to push the contact pads 56, 74 above the surface of the substrate 20, without damaging the first and second flexible circuit members 50, 70, respectively. The raised portion 40 also deforms outward due to being compressed. The contact pads 56, 74 may optionally be bonded to the raised compliant material 40. The raised compliant material 40 supports the flexible circuit members 50, 70, and provides a contact force that presses the contact pads 56, 74 against the contact pads 60, 76 as the first and second circuit members 62, 78, respectively are compressed against the compliant interconnect assembly 34. The movement of the contact pads 56, 74 is controlled by the raised portion 40 of the compliant material 38 and the resiliency of the flexible circuit members 50, 70. These components are engineered to provide a desired level of compliance. The raised portions 40 provide a relatively large range of compliance of the contact pads 56, 74. The nature of the flexible circuit members 50, 70 allow fine pitch interconnect and signal escape routing, but also inherently provides a mechanism for compliance.

In the illustrated embodiment, the electric trace 54 extends between solder ball 64 and contact pad 56. Similarly, the electric trace 72 extends between the solder ball 80 and the contact pad 74. Consequently, the compliant interconnect assembly 34 operates as a pass-through connector between the contact pad 60 on the first circuit member 62 and the contact pad 76 on the second circuit member 78.

Figure 7:
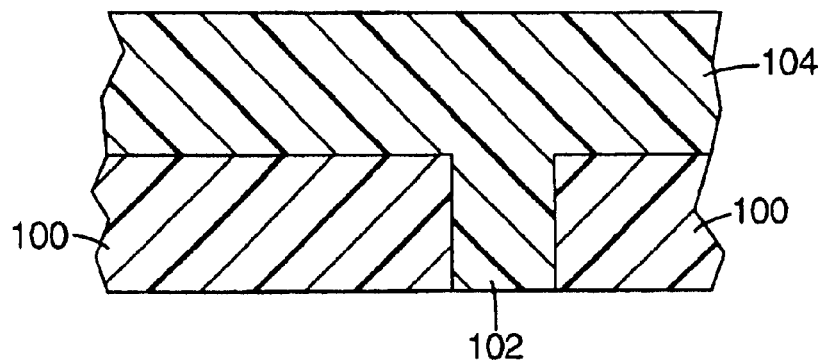
FIGS. 7-9 are side sectional views of an alternate compliant interconnect in accordance with the present invention.
Figure 8:
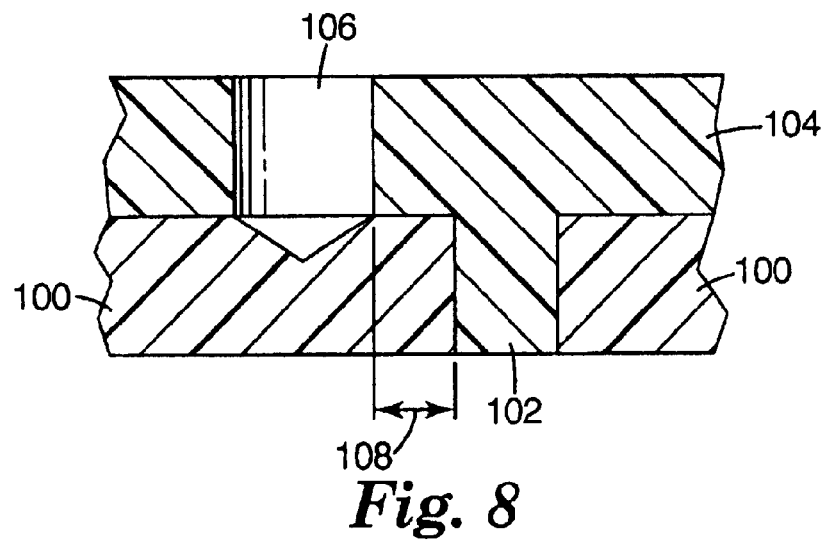

FIG. 7 illustrates an alternate substrate 100 with an array of through holes 102. In the illustrated embodiment, masking material 104 is applied to only one surface of the substrate 100 and the through hole 102. Additional holes 106 are prepared in the masking material 104 and substrate 100 a fixed distance 108 from the hole 102, as illustrated in FIG. 8. The hole 106 is only drilled partially into the substrate 100. A compliant material 110 is then deposited in the hole 106. After the masking material 104 is removed, the resulting compliant interconnect 112 includes a raised compliant material only on one surface (see generally FIG. 11).

Figure 10A:
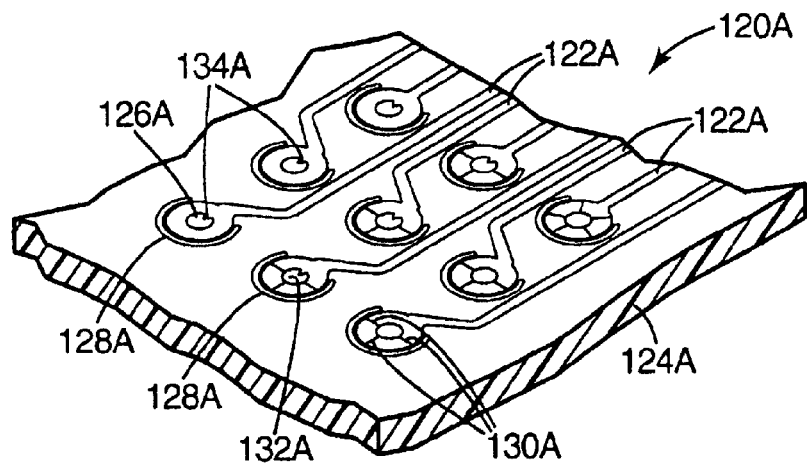
FIG. 10A is a perspective view of a flexible circuit member in accordance with the present invention.

FIG. 10A is a perspective view of a flexible circuit member 120A suitable for use in the present invention. The flexible circuit member 120A includes a series of electrical traces 122A deposited on a polymeric sheet 124A and terminating at an array of contact pads or terminals 126A. As used herein "terminal" refers to an electrical contact location or contact pad. In the illustrated embodiment, the terminals 126A include a singulation 128A. The degree of singulation 128A can vary depending upon the application. For example, in some embodiments the flexible circuit member 120A stretches in order to comply with the raised portions. In other embodiments a greater degree of singulation minimizes or eliminates stretching of the flexible circuit member 120A due to engagement with the raised portions.

In some embodiments, the terminals 126A include one or more locations of weakness 130A. As used herein, "locations of weakness" include cuts, slits, perforations or frangible portions, typically formed in the polymeric sheet 124A and/or a portion of the electrical trace 122A forming the terminal 126A. The locations of weakness facilitate interengagement of an electrical contact, such as a ball contact on a BGA device, with the terminal 126A (see FIG. 19). The terminals 126A can optionally include an aperture 132A to further facilitate engagement with an electrical contact. In another embodiment, a portion 134A of the trace 122A protrudes into the aperture 132A to enhance electrical engagement with the electrical contact.

In other embodiments, a compliant raise portion is attached to the rear of the flexible circuit member 120A opposite the terminal 126A (see FIG. 11). When the flexible circuit member 120A is pressed against a surface (such as a printed circuit board), the raised compliant material lifts the singulated terminal 126A away from the surface.

Figure 10B:
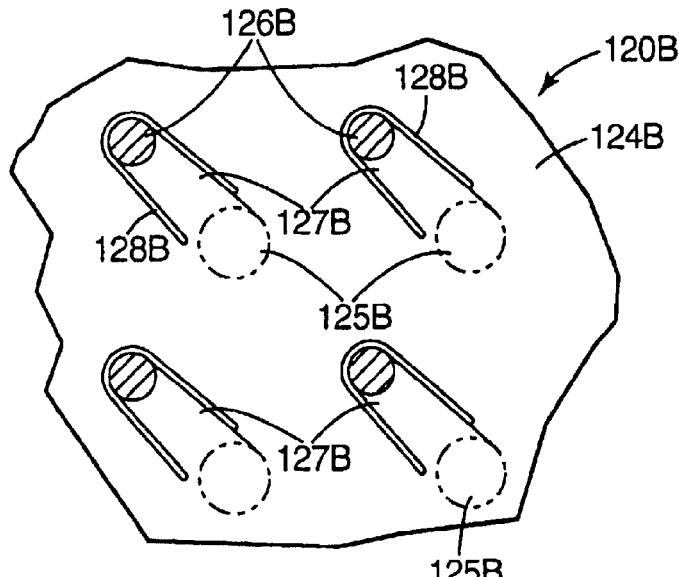
FIG. 10B is a perspective view of an alternate flexible circuit member in accordance with the present invention.

FIG. 10B is a top plan view of an alternate flexible circuit member 120B with an elongated singulation 128B. Contact pads 126B are located on the top of the polymeric sheeting 124B and the solder ball bonding sites 125B are located on the bottom. The contact pads 126B are offset from the solder ball-bonding site 125B by the portion 127B of the polymeric sheeting 124B. An electrical trace can optionally connect the contact pads 125B with the contact pads 126B along the portion 127B. The portion 127B permits the contact pads 126B to be raised up or deflected from the flexible circuit member 120B in order to comply with the motion of the flexure (see for example FIGS. 11-15) with minimal or no deformation or stretching of the surrounding polymeric sheeting 124B. The contact pads 126B can optionally include locations of weakness.

Figure 10C:
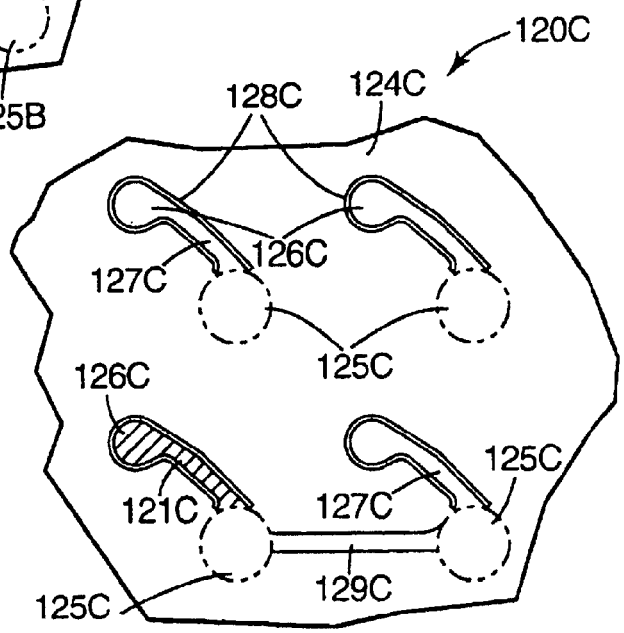
FIG. 10C is a perspective view of another alternate flexible circuit member in accordance with the present invention.

FIG. 10C is a top plan view of an alternate flexible circuit member 120C with an irregularly shaped singulation 128C. Contact pads 126C are located on the top of the polymeric sheeting 124C and the solder ball bonding sites 125C are located on the bottom. The contact pads 126C are offset from the solder ball-bonding site 125C by the irregularly shaped portion 127C of the polymeric sheeting 124C. The shape of the portion 127C determines the force required to raise up or deflect the contact pads 126C from the flexible circuit member 120C in order to comply with the motion of the flexure (see for example FIGS. 11-15). Again, minimal or no deformation or stretching of the surrounding polymeric sheeting 124C is experienced. An electrical trace 121C can optionally connect some of the contact pads 125C with the contact pads 126C along the portion 127C. Additionally, trace 129C can connect two or more contact pads 125C, such as for a common ground plane.

Figure 10D:
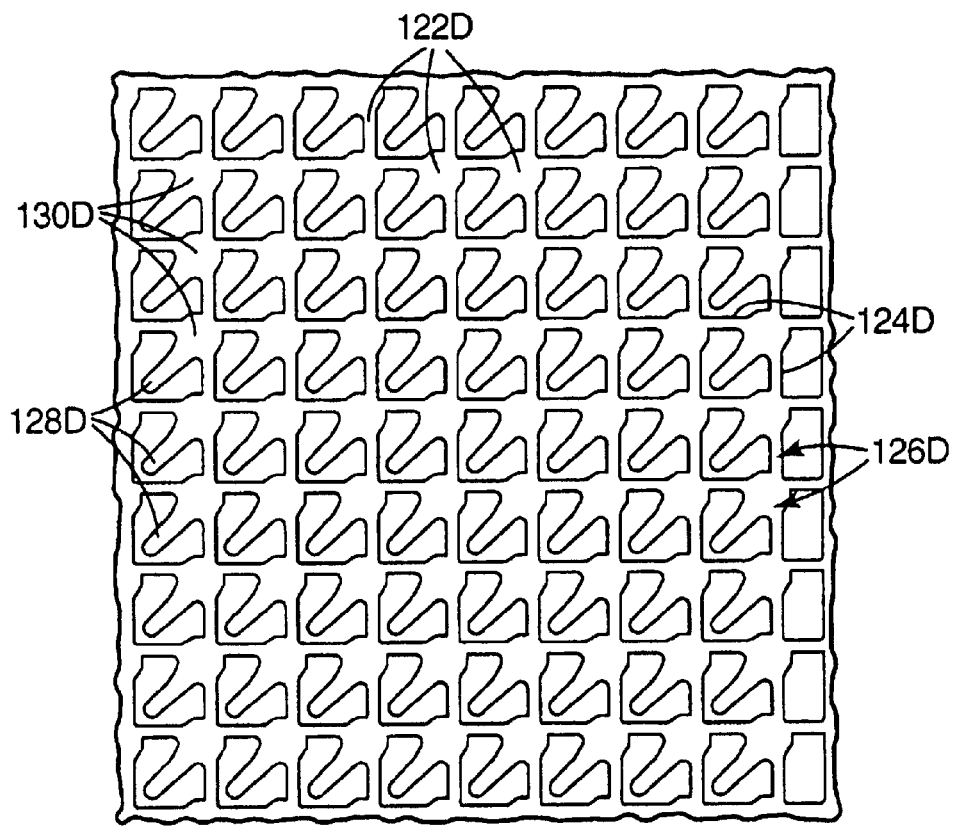
FIG. 10D is a top view of electrical traces of a flexible circuit member prior to singulation.

FIG. 10D is a top plan view of a pattern of electrical traces 122D of a flexible circuit member 120D prior to singulation. In the embodiment of FIG. 10D, the electrical traces 122D include tie bars 124D interconnecting a plurality of compliant members 126D. As will be discussed below, distal ends 128D of the compliant members 126D can be easily deformed out of the plane of the tie bars 124D to electrically couple with other circuit members. For example, the distal ends 128D are configured to electrically couple with contact pads on an LGA device, while proximal ends 130D can electrically couple with a BGA device. Although the distal end 128D is generally linear, it can be configured with a variety of non-linear features, such as curvilinear or serpentine portions (see e.g., FIGS. 10F-10I). The electrical traces 122D are preferably constructed from a copper alloy formed by chemical etching, laser ablation, mechanical stamping or a variety of other techniques.

The electrical traces 122D can optionally be attached to a polymeric sheet, such as illustrated in FIGS. 10A-10C. In another embodiment, the electrical traces 122D are attached to a carrier, such as illustrated in FIG. 12C. The carrier can be rigid, semi-rigid, or flexible. The electrical traces 122D can be attached to a carrier using a variety of techniques, such as lamination with or without adhesives, over molding, insert molding, and a variety of other techniques. In some embodiments, portions of the electrical traces 122D are sufficiently thick to operate as freestanding compliant members, such as illustrated in FIG. 12B.

In the preferred embodiment, the electrical traces 122D are supported by a carrier that maintains the relative position of the individual compliant members 126D after singulation. Singulation is typically accomplished by cutting or removing selected tie bars 124D using chemical etching, laser ablation or mechanical processes. One advantage of the present embodiment is the ability to process an entire field of compliant members 126D as a group. Many different geometries of electrical traces 122D are possible and are shaped based upon the type of terminal to which it must connect.

Figure 10E:
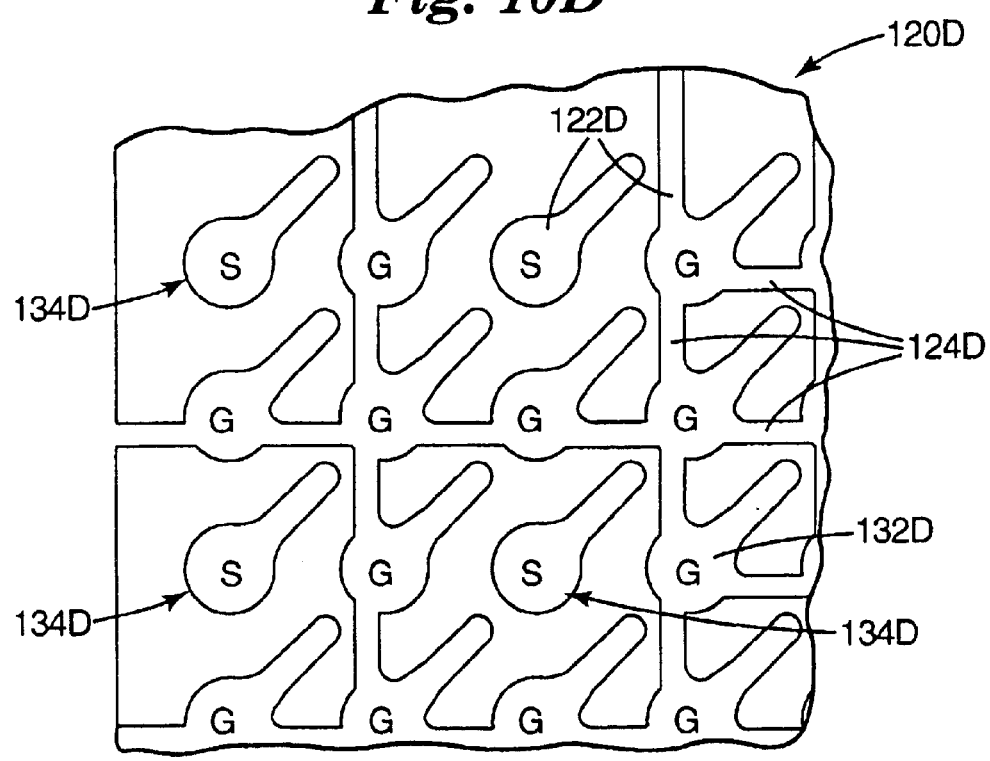
FIG. 10E is a top view of the flexible circuit member of FIG. 10D after singulation.

FIG. 10E is a top plan view of a pattern of electrical traces 122D of a flexible circuit member 120D of FIG. 10D after singulation. The electrical traces 122D are attached to a carrier (see e.g. FIG. 21) so that the relative position of the compliant members 126D remains substantially unchanged even if all tie bars 124D are removed during singulation. In the embodiment illustrated in FIG. 10E, selected tie bars 124D are removed by chemical etching or laser ablation. The compliant members 132D connected by tie bars 124D form a ground plane or power plane. The compliant members 134D that are disconnected from the electrical traces 122D (i.e., discrete compliant members) typically carry electrical signals between the first and second circuit members (see FIG. 21).

Figures 10F, 10G, 10H, 10I:
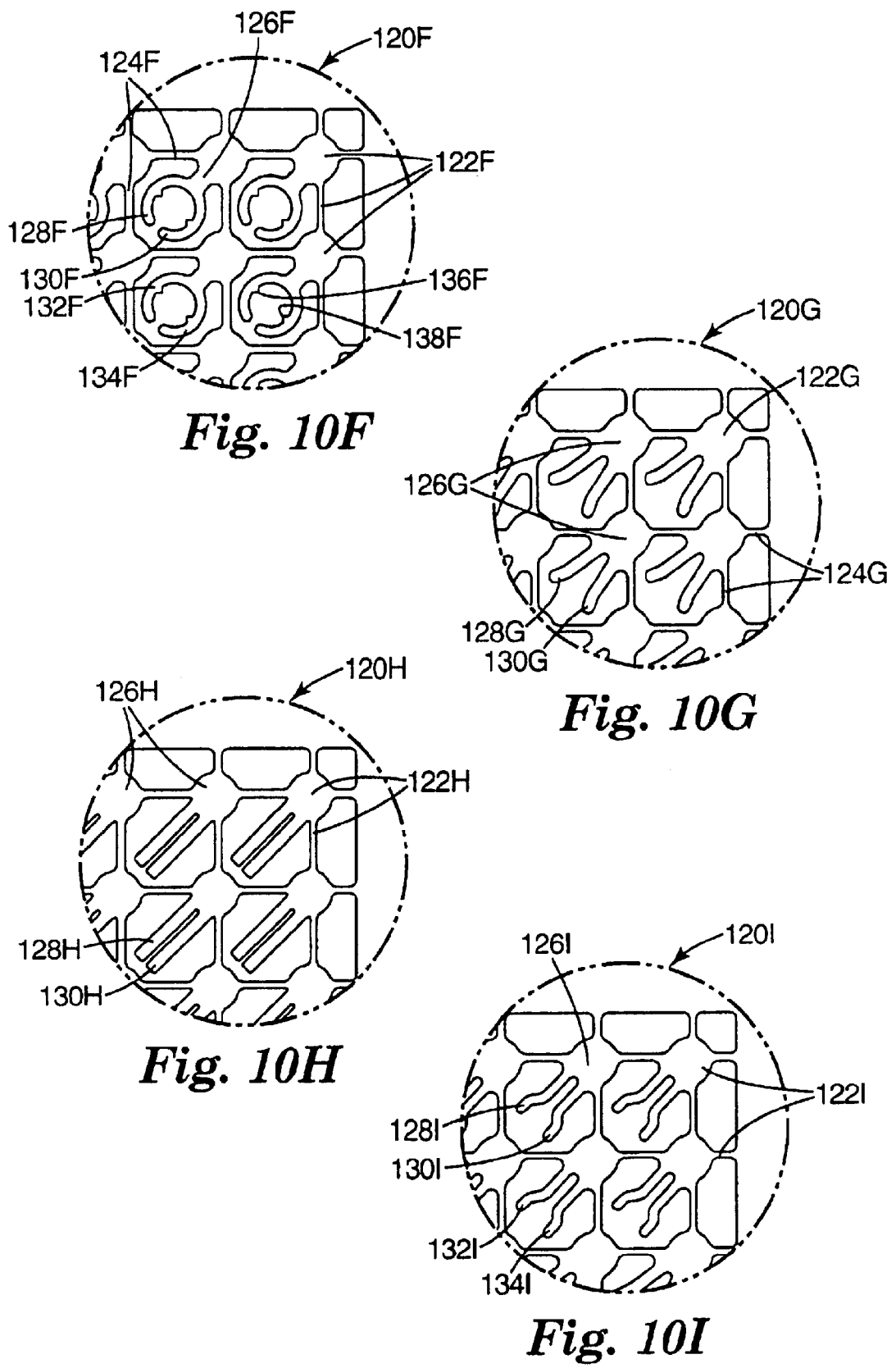
FIG. 10F is a top view of electrical traces of a flexible circuit member prior to singulation.
FIG. 10G is a top view of electrical traces of a flexible circuit member prior to singulation.
FIG. 10H is a top view of electrical traces of a flexible circuit member prior to singulation.
FIG. 10I is a top view of electrical traces of a flexible circuit member prior to singulation.

FIG. 10F is a top plan view of a pattern of electrical traces 122F of a flexible circuit member 120F prior to singulation. The electrical traces 122F include tie bars 124F interconnecting a plurality of compliant members 126F. In the embodiment of FIG. 10F, each compliant member 126F includes a pair of distal ends 128F, 130F. The distal ends 128F, 130F of the compliant members 126F can be easily deformed out of the plane of the tie bars 124F to electrically couple with other circuit members. The distal ends 128F, 130F can be deformed in the same or different directions, depending upon the application (see e.g., FIG. 22). The curved portions 132F, 134F of the distal ends 128F, 130F are particularly well suited to electrically couple with a BGA device. The curved portions 132F, 134F are adapted to create a snap-fit attachment to a ball on BGA circuit member. Members 136F, 138F on the inside edge of the curved portions 132F, 134F facilitate electrical coupling to a BGA device.

FIG. 10G is a top plan view of a pattern of electrical traces 122G of a flexible circuit member 120G prior to singulation. Each compliant member 126G includes a pair of distal ends 128G, 130G. The distal ends 128G, 130G of the compliant members 126G can be easily deformed out of the plane of the tie bars 124G to electrically couple with other circuit members.

FIG. 10H similarly shows a top plan view of a pattern of electrical traces 122H of a flexible circuit member 120H prior to singulation. Each compliant member 126H includes a pair of distal ends 128H, 130H.

FIG. 10I is a top plan view of a pattern of electrical traces 122I where each compliant member 126I includes a pair of curved distal ends 128I, 130I. The curved portions 132I, 134I of the distal ends 128I, 130I are particularly well suited to electrically couple with a BGA device. The curved portions 132I, 134I are adapted to create a snap-fit attachment to a ball on BGA circuit member.

FIG. 11 is a sectional view of an alternate compliant interconnect assembly 140 in accordance with the present invention. The raised compliant material 142 is formed directly on second circuit member 144, which in the embodiment of FIG. 11 is a printed circuit board. In an alternate embodiment, the raised compliant material 142 are formed separate from the second circuit member 144 and subsequently bonded thereto using a suitable adhesive or other bonding technique. In another embodiment, the raised portion 142 is formed on, or bonded to, the rear of flexible circuit member 146. In the illustrated embodiment, the printed circuit board 144 serves the function of both the substrate 20 and the second circuit member 78 illustrated in FIG. 5. The embodiment of FIG. 11 does not require through holes in the circuit member 144.

Flexible circuit member 146 includes a solder ball 148 that is typically reflown to electrically couple bonding pad 150 to the contact pad 152 on the circuit board 144. Alternatively, solder paste can be applied to both the bonding pad 150 and the contact pad 152. Electrical trace 154 electrically couples the solder bonding pad 150 to contact pad 156. Contact pad 156 may optionally include a rough surface to enhance the electrical coupling with the contact pad 160 on the first circuit member 162. The flexible circuit member 146 is singulated so that the raised compliant material 142 lifts the contact pad 156 away from the circuit member 144. When the circuit member 162 is compressed against the compliant interconnect assembly 140, the raised compliant material 142 biases the contact pad 156 against the first circuit member 162. In the compressed state, the compliant interconnect assembly 140 can have a height of about 0.3 millimeters or less. Alternatively, the contact pad 160 can be electrically coupled with the contact pad 156 by reflowing solder or solder paste at the electrical interface, by conductive adhesive at the electrical interface, or either of the above in combination with compression.

The raised compliant material 142 can optionally be doped or filled with rigid or semi-rigid materials to enhance the integrity of the electrical contact created with the contact pad 160 on the first circuit member 162. Bonding layer 164 is optionally provided to retain the contact pad 156 to the raised compliant material 142.

Figure 9:
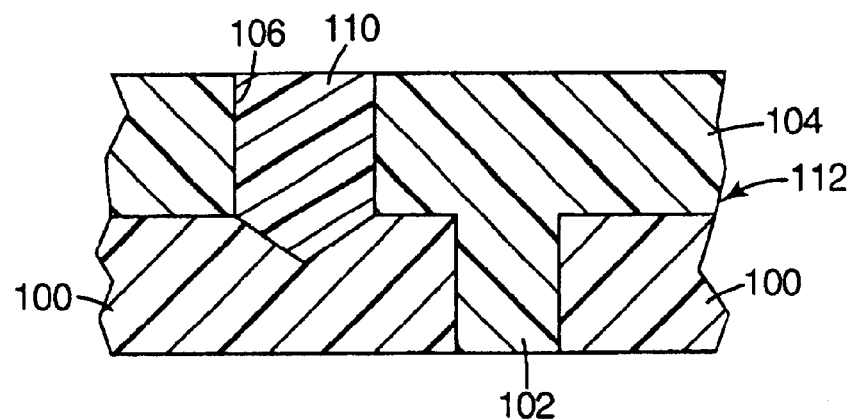
Figure 12A:
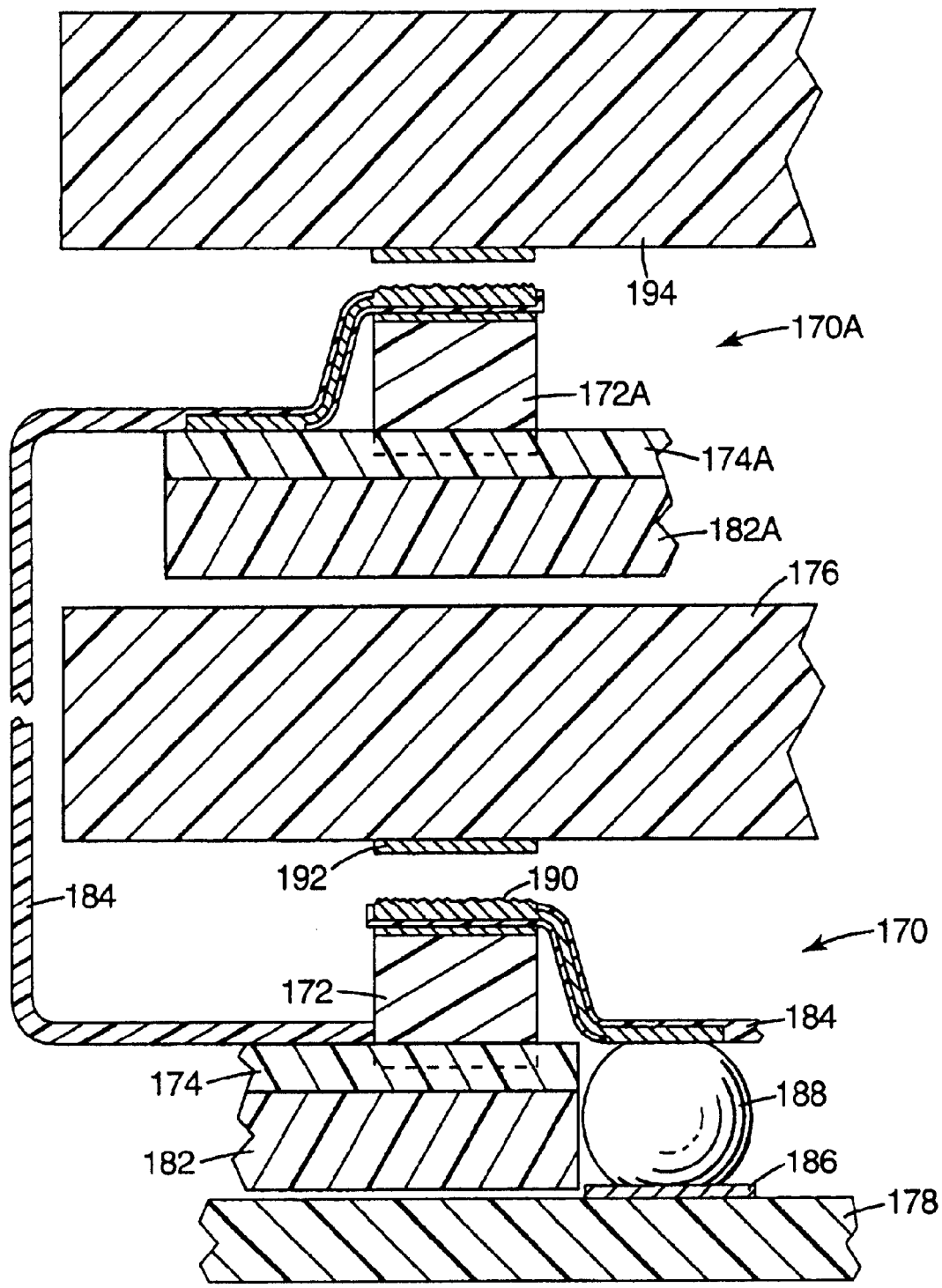
FIG. 12A is a side sectional view of an alternate compliant interconnect assembly in a stacked configuration in accordance with the present invention.
Figure 12B:
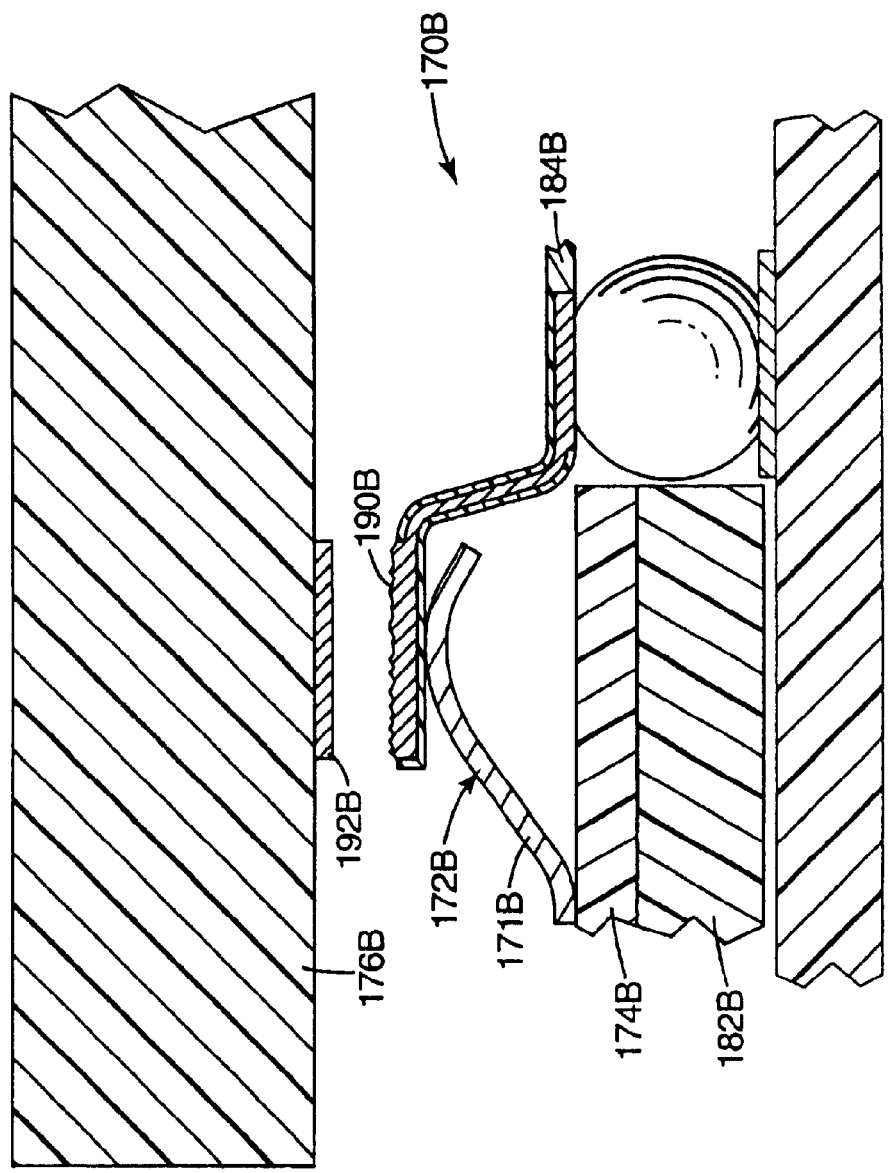
FIG. 12B is a side sectional view of an alternate compliant interconnect assembly with a spring member in accordance with the present invention.

FIG. 12A illustrates an alternate compliant interconnect assembly 170 using a compliant interconnect generally as illustrated in FIGS. 7-9. Raised compliant material 172 is attached to a carrier 174 that is interposed between first and second circuit members 176, 178. The carrier 174 can be rigid or flexible. An additional support layer 182 can optionally be added to the carrier 174 to increase rigidity and/or compliance. In one embodiment, the raised compliant material 172 has a first modulus of elasticity and the additional support layer 182 has a second modulus of elasticity different from the first modulus of elasticity. In another embodiment, the raised compliant material 172 is attached to the rear surface of flexible circuit member 184.

Flexible circuit member 184 is electrically coupled to the contact pad 186 on second circuit member 178 by solder ball or solder paste 188. When the first circuit member 176 is compressively engaged with the compliant interconnect assembly 170, raised compliant material 172 biases contact pad 190 on the flexible circuit member 184 against contact pad 192 on the first circuit member 176. In an embodiment where the carrier 174 has compliant properties, the combined compliant properties of the carrier 174 and raised compliant material 172 provides the bias force.

In another embodiment, the flexible circuit member 184 extends to a second interconnect assembly 170A. Any of the interconnect assemblies disclosed herein can be used as the interconnect assembly 170A. In the illustrated embodiment, raised compliant material 172A is attached to a carrier 174A that is interposed between first circuit members 176 and a third circuit member 194. The carrier 174A can be rigid or flexible. An additional support layer 182A can optionally be added to the carrier 174A to increase rigidity and/or compliance. The third circuit member 194 can be an integrated circuit device, such as the LGA device illustrated in FIG. 12A, a PCB or a variety of other devices. The entire assembly of circuit members 176, 178, 194 can be stacked together and the solder then mass reflowed during final assembly.

FIG. 12B illustrates an alternate compliant interconnect assembly 170B generally as illustrated in FIG. 12A, except that the raised compliant material 172B attached to a carrier 174B is an elongated compliant member 171B. The compliant member 171B can be spring member or a rigid member attached to a compliant carrier 174B, such as a beryllium copper spring. An additional support layer 182B can optionally be added to the carrier 174B to increase rigidity and/or compliance. The compliant members 171B provide reactive support to urge the contact pad 190B on the flexible circuit member 184B against the contact pad 192B on the first circuit member 176B. The compliant member 171B can be formed in the carrier 174B or formed separately and attached thereto. The compliant member 171B can alternatively be a coil spring or a variety of other structures.

FIG. 12C illustrates another alternate compliant interconnect assembly 170C generally as illustrated in FIG. 12B, except that the raised compliant material 172C is an elongated compliant member 171C supporting the flexible circuit member 184C. Substrate 174C includes a series of compliant spring members 171C positioned under the flexible circuit member 184C. The upper surface of the flexible circuit member 184C is patterned with a series of rough contact pads 190C. The lower surface of the flexible circuit member 184C is prepared to receive solder paste or solder ball 194C. The rigid substrate 174C also includes a series of solder deposit alignment openings 175C through which solder ball 194C can couple the lower surface of the flexible circuit member 184C with second circuit member 198C. The compliant members 171C provide reactive support to bias the flexible circuit member 184C against contact pad 192C on first circuit member 176C.

FIG. 12D illustrates another alternate compliant interconnect assembly 170D generally as illustrated in FIG. 12C, except that the raised compliant material 172D operates without the polymeric sheeting of a flexible circuit member. The thickness of the compliant member 172D can be engineered to provide the desired amount of resiliency. Substrate 174D includes a series of conductive compliant members 171D positioned to engage with the contact pad 192D on the first circuit member 176D. The lower surface of the conductive compliant member 171D is prepared to receive solder paste or solder ball 194D. The substrate 174D also includes a series of solder deposit alignment openings 175D through which solder ball 194D can couple the lower surface of the conductive compliant members 171D with second circuit member 198D.

Figure 13:
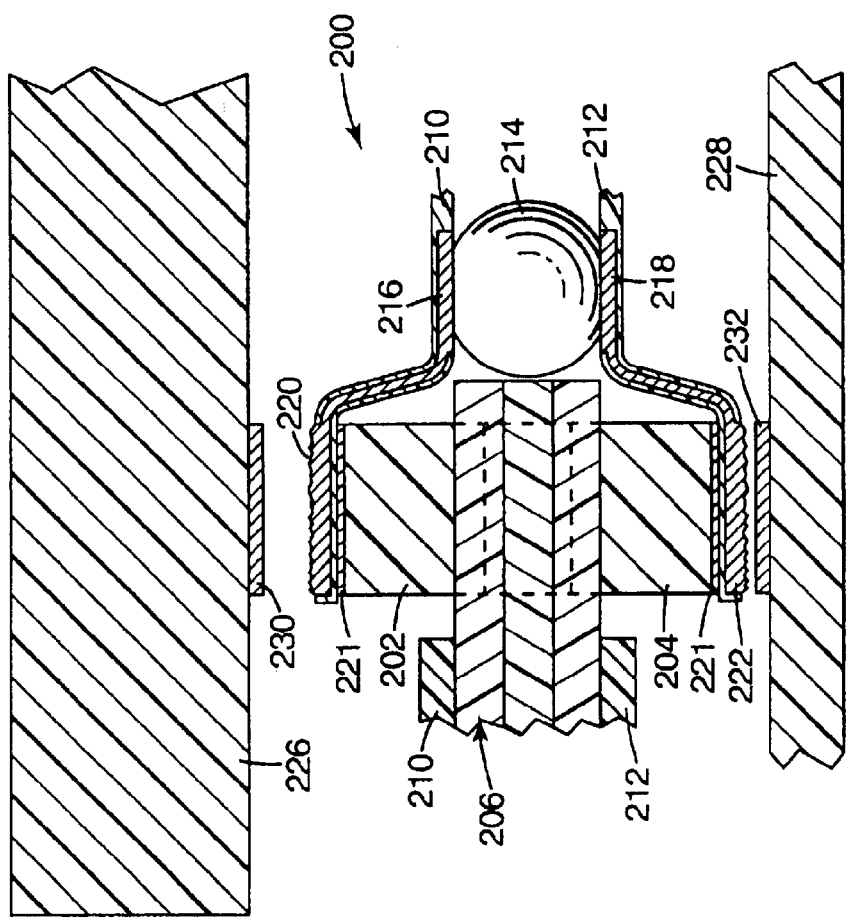
FIG. 13 is a side sectional view of an alternate compliant interconnect assembly with a carrier in accordance with the present invention.

FIG. 13 illustrates an alternate compliant interconnect assembly 200 in accordance with the present invention. A pair of discrete compliant raised portions 202, 204 are attached to a carrier 206. In the illustrated embodiment, the carrier 206 is a multi-layered structure. First and second flexible circuit members 210, 212 are positioned on opposite sides of the compliant interconnect assembly 200, generally as illustrated in FIG. 6. Solder ball 214 connects solder ball pads 216, 218 on the respective flexible circuit members 210, 212. The solder ball 214 can be replaced by a variety of connection methods such as wedge bonding, ultrasonic bonding, resistance bonding, wire bonding, or iso-tropic/anisotropic conductive adhesives.

Contact pads 220, 222 on the respective flexible circuit members 210, 212 are singulated. Adhesive 221 can optionally be used to bond contact pads 220, 222 to the raised compliant material 202, 204. The flexible circuit members 210, 212 can optionally be bonded to the carrier 206. The resulting compliant interconnect assembly 200 is interposed between first and second circuit members 226, 228 in a compressive relationship so that contact pads 220, 222 are compressively engaged with respective contact pads 230, 232.

Figure 14A:
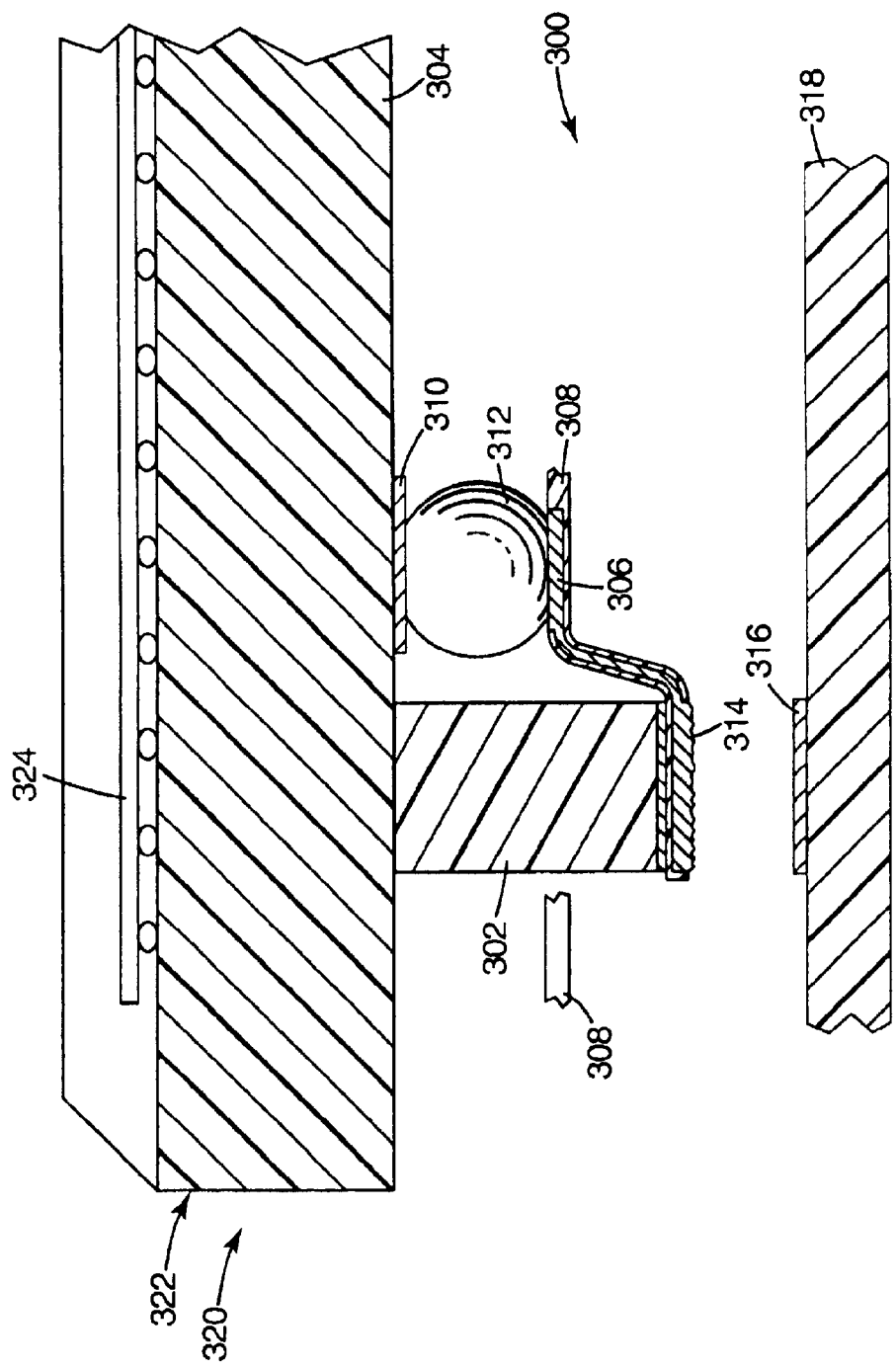
FIG. 14A is a side sectional view of a compliant interconnect assembly on an integrated circuit device in accordance with the present invention.

FIG. 14A illustrates an alternate compliant interconnect assembly 300 in accordance with the present invention. The raised compliant material 302 is located on the first circuit member 304. The raised compliant material 302 can be bonded to both the first circuit member 304 and the rear of contact pad 314. In the illustrated embodiment, the first circuit member 304 is a packaged integrated circuit device. The first circuit member 304 can alternately be a printed circuit board, another flexible circuit, a bare-die device, an integrated circuit device, an organic or inorganic substrate, a rigid circuit and virtually any other type of electrical component. Solder ball pad 306 on the flexible circuit member 308 is electrically coupled to contact pad 310 on the first circuit device 304 by solder ball 312. Contact pad 314 on the flexible circuit member 308 is supported by raised compliant material 302. The contact pad 314 can be compressively engaged with pad 316 on the second circuit member 318.

In an alternate embodiment, FIG. 14A illustrates a connector-on-package 320 in accordance with the present invention. The first circuit device 304 forms a substrate for package 322 containing bare die device 324. In the illustrated embodiment, the bare die device 324 is a flip chip and/or wire bond integrated circuit structure, although any packaged integrated circuit device can be used in the present connector on package 320 embodiment. The compliant interconnect assembly 300 is formed on the substrate 304 as discussed above, yielding a packaged integrated circuit 324 with an integral connector 300.

Figure 14B:
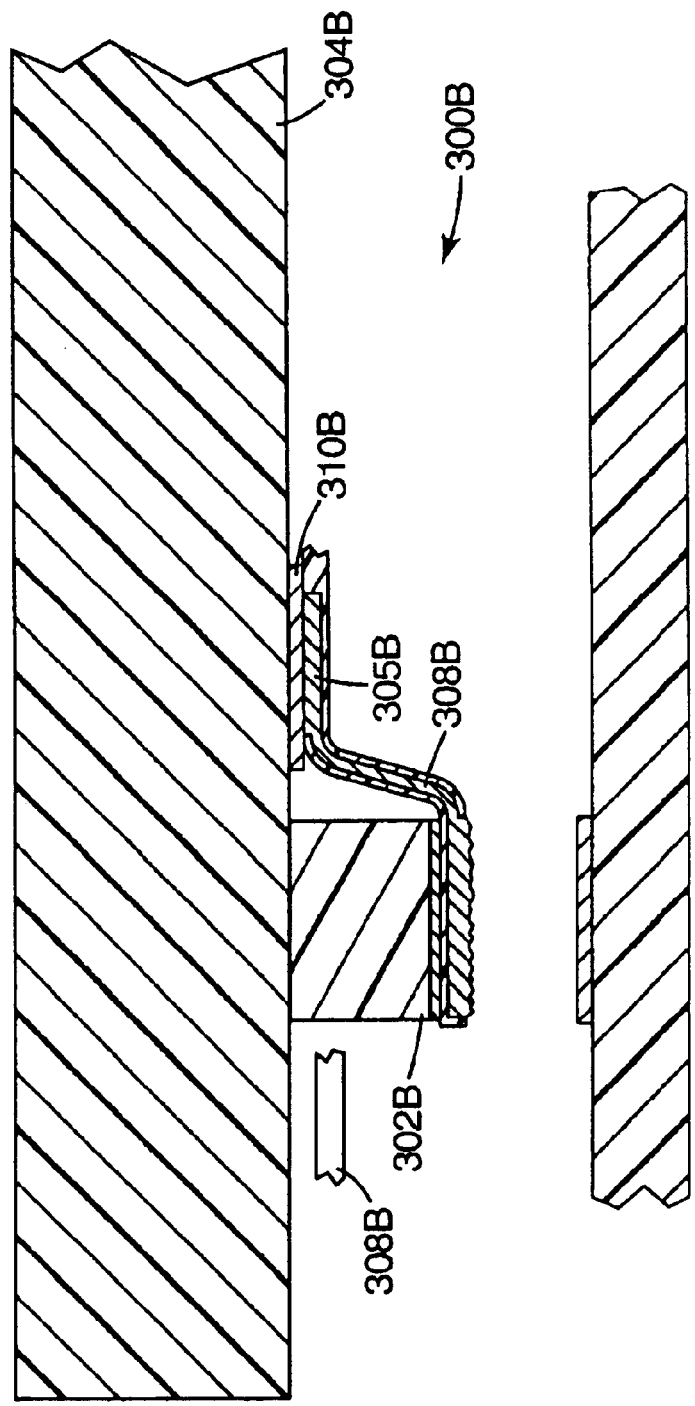
FIG. 14B is a side sectional view of an alternate compliant interconnect assembly on an integrated circuit device in accordance with the present invention.

FIG. 14B illustrates an alternate compliant interconnect assembly 300B generally as shown in FIG. 14A. Contact pad 305B on the flexible circuit member 308B is electrically coupled directly to the contact pad 310B on the first circuit member 304B. The raised compliant material 302B is attached to the circuit member 304B and is reduced in height to compensate for the height loss due to removal of the solder ball. The first circuit member 304B can be a printed circuit board, another flexible circuit, a bare-die device, an integrated circuit device, an organic or inorganic substrate, a rigid circuit and virtually any other type of electrical component.

FIG. 15A illustrates an alternate compliant interconnect assembly 400 in accordance with the present invention. Raised compliant material 402 is mounted on a carrier 404 that is positioned adjacent to the first circuit member 406. In the illustrated embodiment, the first circuit member 406 is a packaged integrated circuit device. The carrier 404 can be optionally bonded to the first circuit member 406. Ball grid array (BGA) solder ball 408 (or solder paste) is used to electrically couple contact pad 410 on the first circuit member 406 with the solder ball pad 412 on the flexible circuit member 414. The singulated contact pad 416 on the flexible circuit member 414 is supported by the raised compliant material 402 for compressive engagement with contact pad 418 on the second circuit member 420.

In one application, the embodiment of FIG. 15A can be used to "connectorize" a conventional BGA device 422 by adding the compliant interconnect assembly 400. In essence, the compliant interconnect assembly 400 can be merged into an existing BGA device 422 to form an assembly 401 comprising the packaged integrated circuit 406 and the compliant interconnect assembly 400. The contact pads 416 can simply be pushed against the PCB 420 to create a solderless connection without actually mounting a connector on the PCB 420. Alternately, solder at the interface of the contact pads 416, 418 can be reflowed. The assembly 401 can be provided as a conversion kit for integrated circuit devices, thereby eliminating the need for a connector on the printed circuit board 420. The connectorized embodiment of FIG. 15A can be used with any type of packaged integrated circuit, such as an LGA, PLCC, PGA, SOIC, DIP, QFP, LCC, CSP, or other packaged or unpackaged integrated circuits.

Figure 15B:
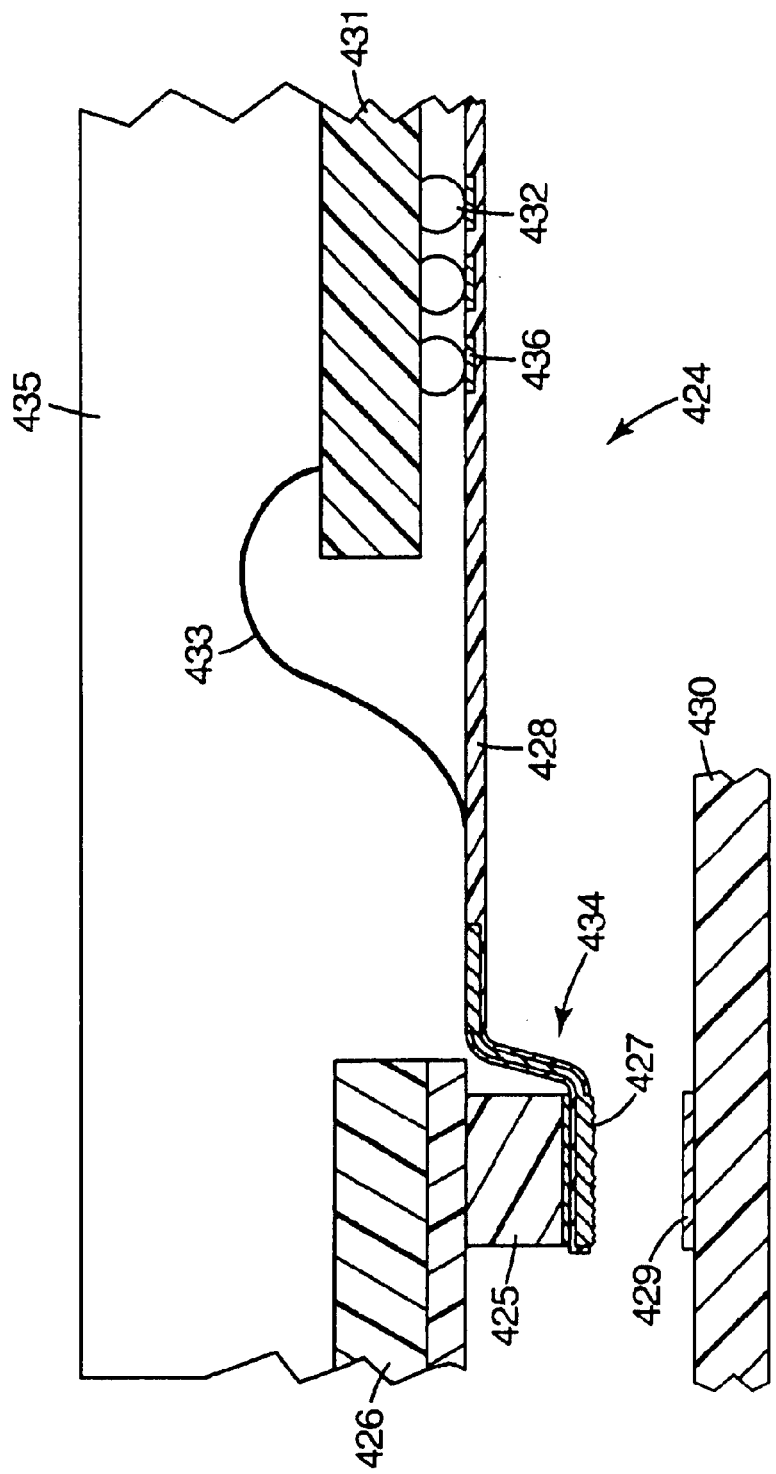
FIG. 15B is a side sectional view of a compliant interconnect assembly packaged with an integrated circuit device in accordance with the present invention.

FIG. 15B illustrates an alternate connectorized integrated circuit device 424 in accordance with the present invention. The compliant interconnect 434 includes raised compliant material 425 mounted on a carrier 426. Singulated contact pad 427 on flexible circuit member 428 is supported by the raised compliant material 426 for compressive engagement with contact pad 429 on the first circuit member 430. The connection between the contact pads 427, 429 can be created by compression or the reflow of solder. Integrated circuit device 431 is direct connected to the flexible circuit member 428. The integrated circuit device 431 can be electrically coupled to the flexible circuit member 428 by flip chip bumps 432 and/or wire bonds 433. Alternatively, terminals 436 on the integrated circuit device 431 can include locations of weakness (see FIG. 10A) that permit the bumps 432 to be snap-fit with the flexible circuit member 428 (see FIG. 19). The integrated circuit device can be an unpackaged bare die device. In one embodiment, the integrated circuit device 431, the compliant interconnect 434 and a portion of the flexible circuit member 428 can be retained in package 435.

Figure 16:
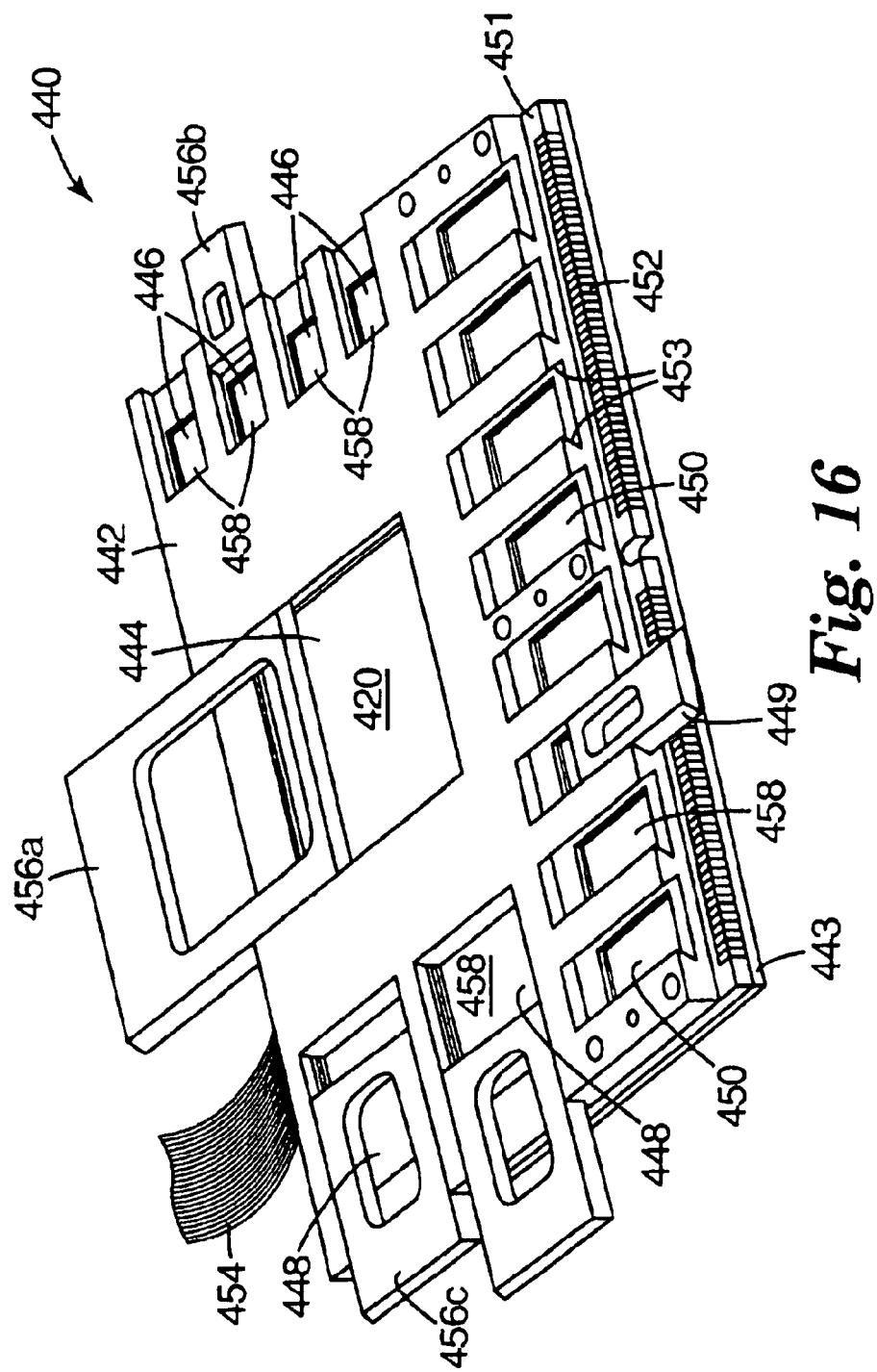
FIG. 16 is a replaceable chip module using the compliant interconnect assembly in accordance with the present invention.

FIG. 16 is a perspective view of a replaceable chip module 440 coupled to a flexible circuit member 454 using a compliant interconnect assembly in accordance with the present invention. The housing 442 includes a plurality of device sites 444, 446, 448, 450 configured to receive various first circuit members. The housing 442 can be an insulator housing or an alignment frame, typically constructed from plastic or shielded metal.

In one embodiment, the replaceable chip module 440 illustrated in FIG. 16 includes a second circuit member 451, such as a PCB, having a 168 DIMM edge card connector 452 along one edge. Flex circuit member 454 is interposed between the second circuit member 451 and the housing 442 to form compliant interconnect assemblies 458 at one or more of the device sites 444, 446, 448, 450. Various integrated circuit devices can be located at the device sites 444, 446, 448, 450. The flexible circuit member 454 may extend across the entire second circuit member 451, or just a portion thereof. Any of the compliant interconnect assemblies disclosed herein can be used for this purpose. The raised compliant material can correspondingly be formed on the first or second circuit members, or the substrate (see for example FIG. 5).

In another embodiment, the second circuit member 451 is an extension of the flexible circuit member 454. Stiffener 443 is optionally provided behind the flexible circuit member 451.

The housing 442 includes a device site 444 for receiving a microprocessor device. Along one edge of the housing 442 are a series of device sites 446 configured to receive flash memory integrated circuit devices. Device sites 448, 450 are provided along the other edges of the housing 442 for receiving other circuit members supportive of the microprocessor. Each of the device sites 444, 446, 448, 450 optionally include appropriate covers 456a–456c. The covers 456a–456c have beveled edges 449 for sliding engagement with a corresponding lips 453 on the housing 442.

The flexible circuit member 454 extends beyond the housing 442, permitting it to perform more functions than simple providing an interconnect between the first and second circuit members. For example, the flexible circuit member 454 can include integrated ground planes; buried passive functions such as capacitance; redistribution of terminal routing or pitch; and/or leads to bring in other signals or power from external sources to the device being connected without having to come in through the PCB 451. Using the flexible circuit member to perform other functions reduces the number of terminals need to be connected to the main PCB 451 since all of the ground pins from the first circuit members can be coupled to the flex circuit and/or the substrate. Another advantage of this embodiment is that it is possible to alter the signals or power coming in through the flexible circuit member 454, such as filtering, amplifying, decoupling etc.

Figure 17:
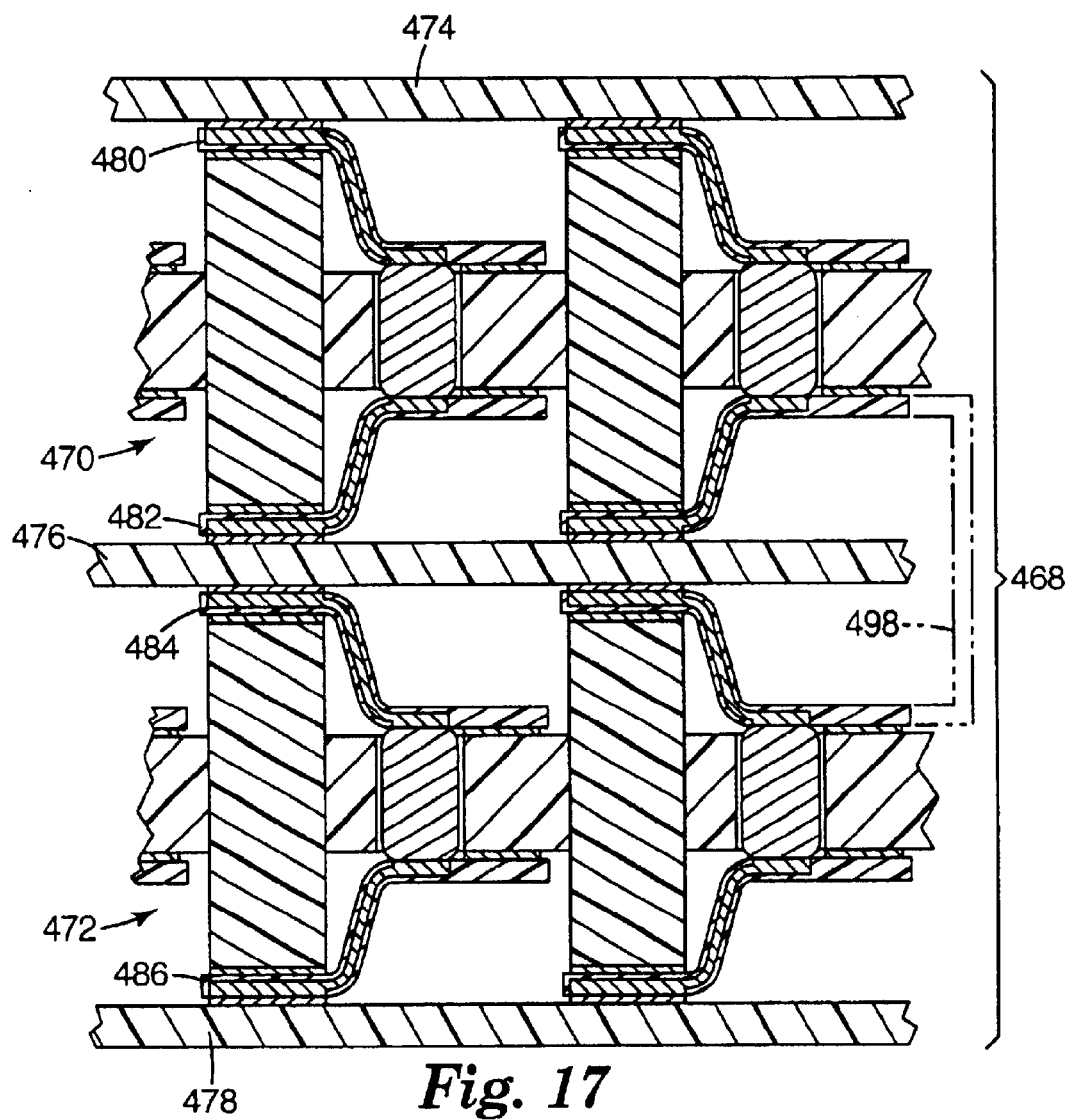
FIG. 17 is a side sectional view of a plurality of compliant interconnect assemblies in a stacked configuration in accordance with the present invention.
Figure 18:
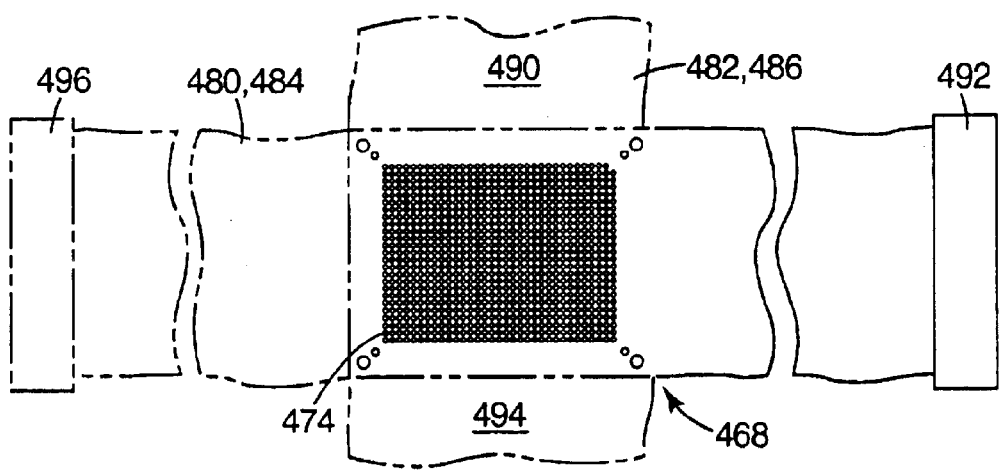
FIG. 18 is a top view of a compliant interconnect assembly with the flexible circuit members extending therefrom in accordance with the present invention.

FIG. 17 is a side sectional view of an assembly 468 comprising multiple compliant interconnect assemblies 470, 472 arranged in a stacked configuration with multiple circuit members 474, 476, 478 in accordance with the present invention. The interconnect assemblies 470, 472 correspond generally with those illustrated in FIG. 6, although any of the interconnect assemblies disclosed herein can be arranged in a stacked configuration. The circuit members 474, 476, 478 can be printed circuit boards, flexible circuits, bare-die devices, integrated circuit devices, organic or inorganic substrates, rigid circuits or combinations thereof. The assembly 468 is typically located in a housing (see FIG. 16) to maintain alignment and a compressive relationship with the various components. The four flexible circuit members 480, 482, 484, 486 can be arrange parallel to each other or at various angles. Additionally, the flexible circuit members 480, 482, 484, 486 can be connected to each other, such as the connection 498 connecting flexible circuit member 482 to flexible circuit member 484. FIG. 18 illustrates one possible arrangement of the flexible circuit members 480, 482, 484, 486 layered together with the circuit member 474 on top of the assembly 468. Distal ends 490, 492, 494, 496 of the various flexible circuit members 480, 482, 484, 486 are free to connect to other circuits.

Figure 19:
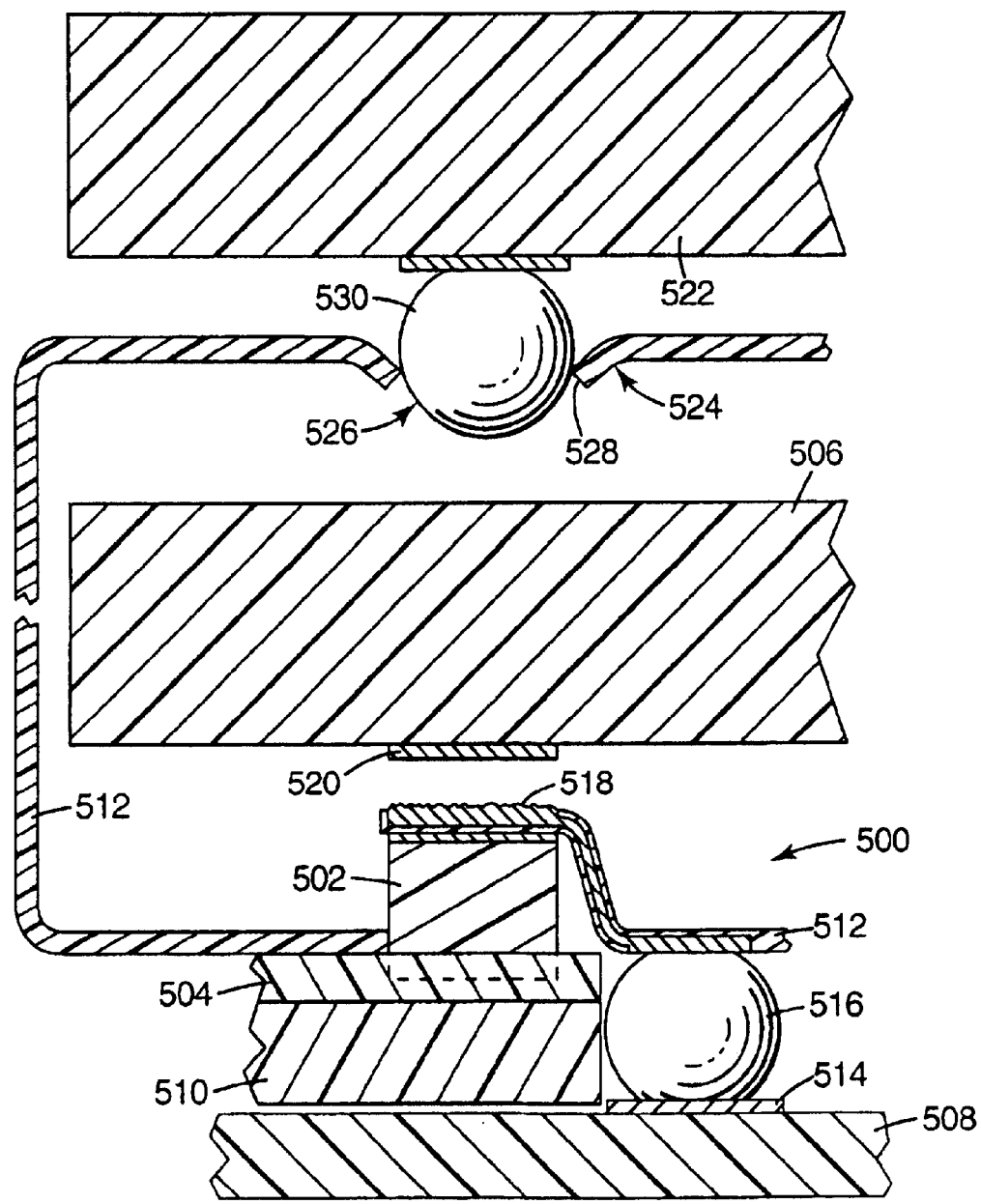
FIG. 19 is a side sectional view of a plurality of circuit members in a stacked configuration coupled using a compliant interconnect assembly in accordance with the present invention.

FIG. 19 illustrates an alternate compliant interconnect assembly 500 using a compliant interconnect generally as illustrated in FIG. 12A. Raised compliant material 502 is attached to a carrier 504 that is interposed between first and second circuit members 506, 508. The carrier 504 can be rigid or flexible. An additional support layer 510 can optionally be added to the carrier 504 to increase rigidity and/or compliance. Flexible circuit member 512 is electrically coupled to the contact pad 514 on second circuit member 508 by solder ball or solder paste 516. When the first circuit member 506 is compressively engaged with the compliant interconnect assembly 500, raised compliant material 502 biases contact pad 518 on the flexible circuit member 512 against contact pad 520 on the first circuit member 506.

In one embodiment, the flexible circuit member 512 extends to a third circuit member 522. The third circuit member 522 can be electrically coupled using any of the techniques disclosed herein, including the connectorized approach illustrated in FIG. 15B. In the illustrated embodiment, terminals 524 on the flexible circuit 512 include an aperture 526 and a plurality of locations of weakness 528 (see FIG. 10A). The locations of weakness 528 permit solder ball 530 to snap-fit into aperture 526 to form a strong mechanical interconnect. The solder ball 530 can optionally be reflowed to further bind with the terminal 524. If the solder ball 530 is reflowed, the segmented portions of the terminal 524 will flex into the molten solder. When the solder solidifies, the terminal 524 will be at least partially embedded in the solder ball 530. The third circuit member 522 can be an integrated circuit device, such as an LGA device, BGA device, CSP device, flip chip, a PCB or a variety of other devices.

Figure 20:
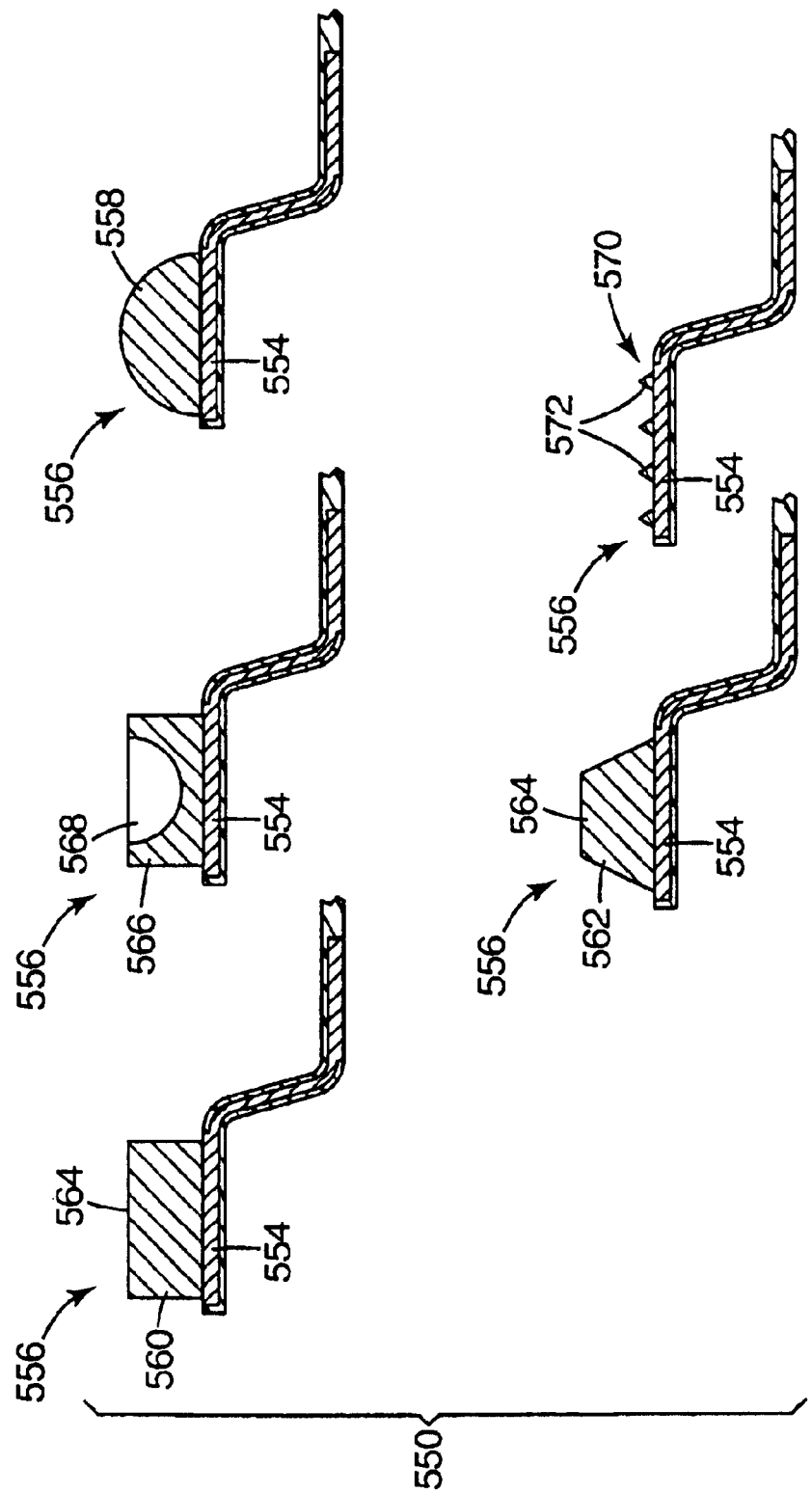
FIG. 20 is a side sectional view of various structures on a flexible circuit member for electrically coupling with a circuit member.

FIG. 20 is a schematic illustration of various conductive structures 556 formed on the contact pads 554 of flexible circuit member 550. The conductive structures 556 facilitate electrical coupling with various types of contact pads on a circuit member. The structures 556 can be metal pieces soldered to the contact pads 554, a build-up of solder or conductive adhesive or other conductive members bonded to the contact pads 554. Structures 560 and 562 include generally flat upper surfaces 564 suitable to engage with an LGA device. Structure 566 includes a recess 568 generally complementary to the contact pads on a BGA device.

Structure 570 includes a series of small protrusions 572 designed to frictionally engage with various contact pads. Structure 558 is a solder bump, such as may be found on a BGA device. The conductive structures 556 can be coupled with a circuit member using compression and/or reflowing the solder.

Figure 21:
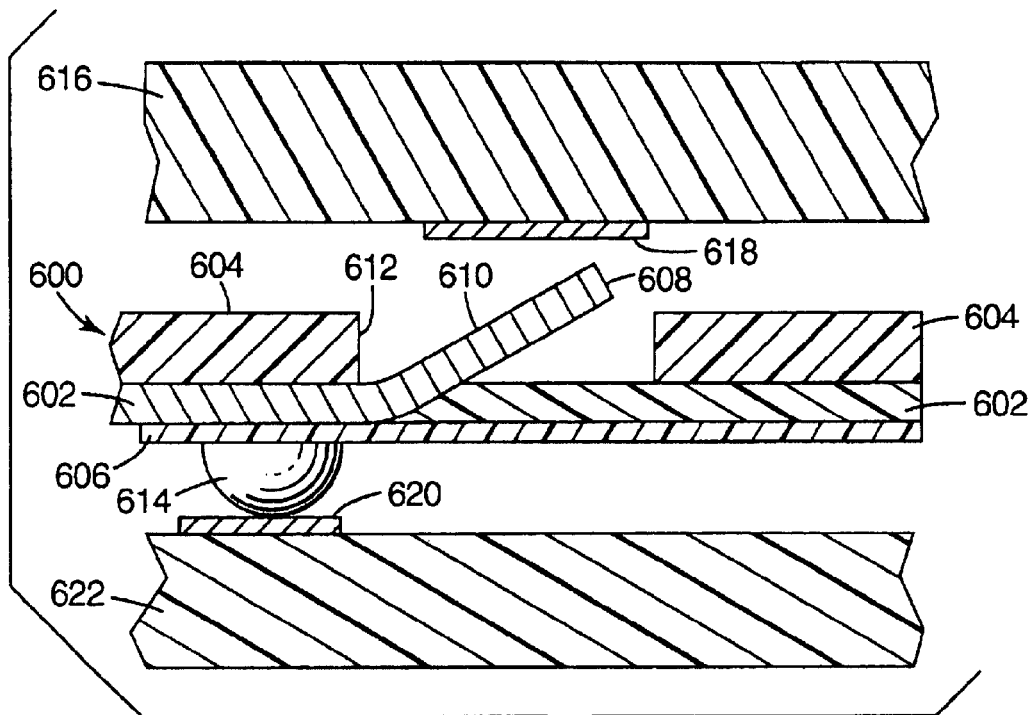
FIG. 21 is a side sectional view of an alternate compliant interconnect assembly using one of the flexible circuit members of FIGS. 10D-10I.

FIG. 21 illustrates an alternate compliant interconnect assembly 600 using an electrical trace 602 generally as illustrated in FIGS. 10D-10I. The electrical trace 602 is attached to carrier 604. The carrier 604 can be a rigid or a flexible dielectric material. After the electrical trace 602 is singulated, a second dielectric carrier 606 can optionally be located on the opposite surface. Distal ends 608 of the compliant members 610 are deformed to extend through openings 612 in the carrier 604.

In the illustrated embodiment, the distal end 608 is deformed in a first direction and a solder ball 614 is electrically coupled to the proximal end of the compliant member 610. When a first circuit member 616 is compressively engaged with the compliant interconnect assembly 600, distal end 608 of the compliant member 610 electrically couples with contact pad 618 on the first circuit member 616. Solder ball 614 is preferably melted to electrically couple with contact pad 620 on second circuit member 622. The embodiment of FIG. 21 is particularly suited to releasably attaching a bare die device 616 to a printed circuit board 622.

The compliant interconnect assembly 600 is typically constructed by etching electrical trace 602. A photoresist is printed onto tie bars that are to be removed. The distal ends 608 are then deformed and the electrical trace 602 is plated. The photoresist is then removed and the electrical trace 602 is laminated to the carrier 604. An acid bath is used to etch away the tie bars that were previously covered with the photoresist. The carrier 604 holds the compliant members 610 in position. The second dielectric carrier 606 is then optionally laminated to the opposite side of the electrical trace 602.

Figure 22:
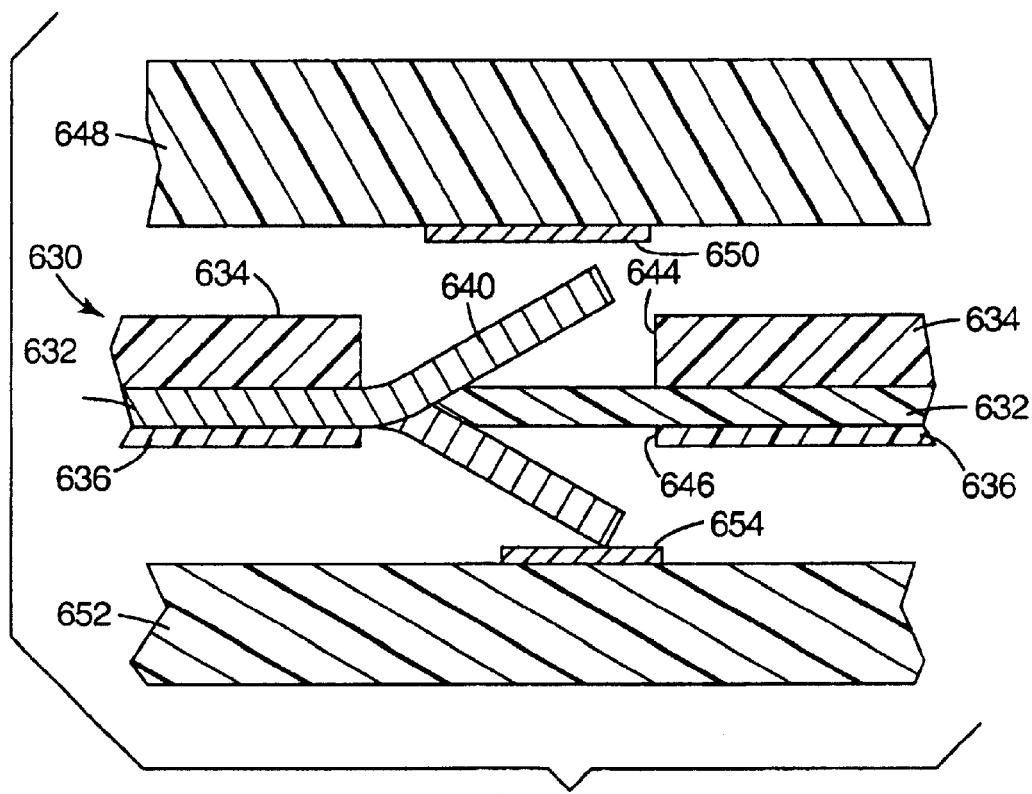
FIG. 22 is a side sectional view of an alternate compliant interconnect assembly using one of the flexible circuit members of FIGS. 10F-10I.

FIG. 22 illustrates an alternate compliant interconnect assembly 630 using an electrical trace 632 generally as illustrated in FIGS. 10F-10I. The electrical trace 632 is attached to carrier 634. After the electrical trace 632 is singulated, a second dielectric carrier 636 can optionally be located on the opposite surface. In the embodiment of FIG. 22, each compliant member 638 includes at least two distal ends 640, 642. The distal end 640 is deformed to extend through openings 644 in the carrier 634 and the distal end 642 is deformed to extend through the opening 646 in the carrier 636.

When a first circuit member 648 is compressively engaged with the compliant interconnect assembly 630, distal end 640 electrically couples with contact pad 650 on the first circuit member 648. Similarly, a second circuit member 652 can be compressively engaged with the distal end 642 to electrically couples with contact pad 654 on the second circuit member 652.

Figure 23:
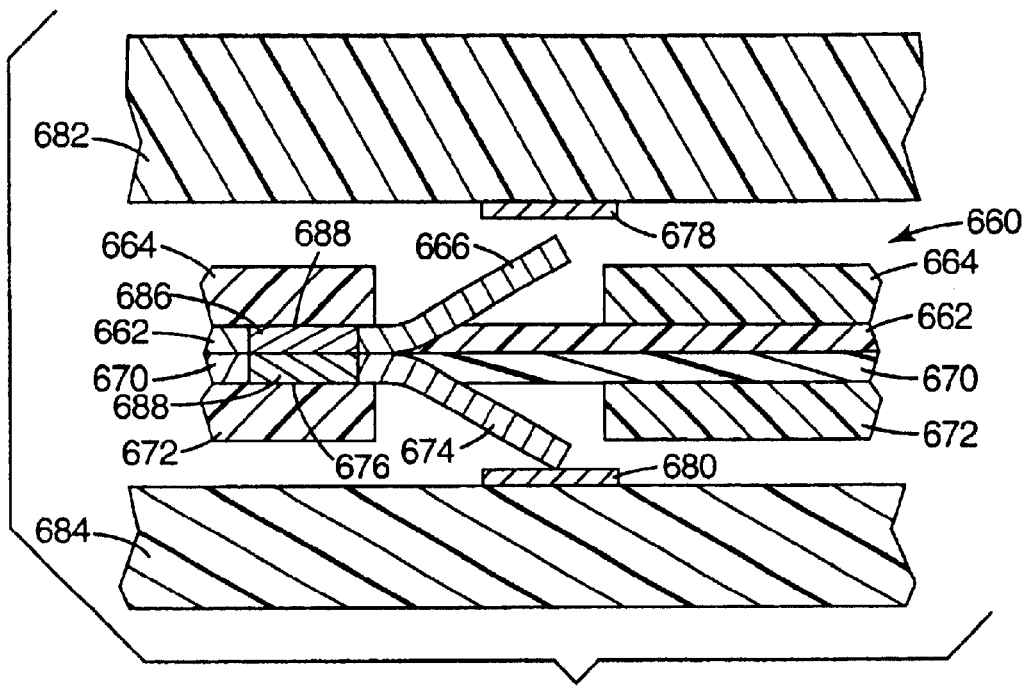
FIG. 23 is a side sectional view of an alternate compliant interconnect assembly using a pair of the flexible circuit members, such as illustrated in FIGS. 10D-10I, in a back to back configuration.
Figure 24:
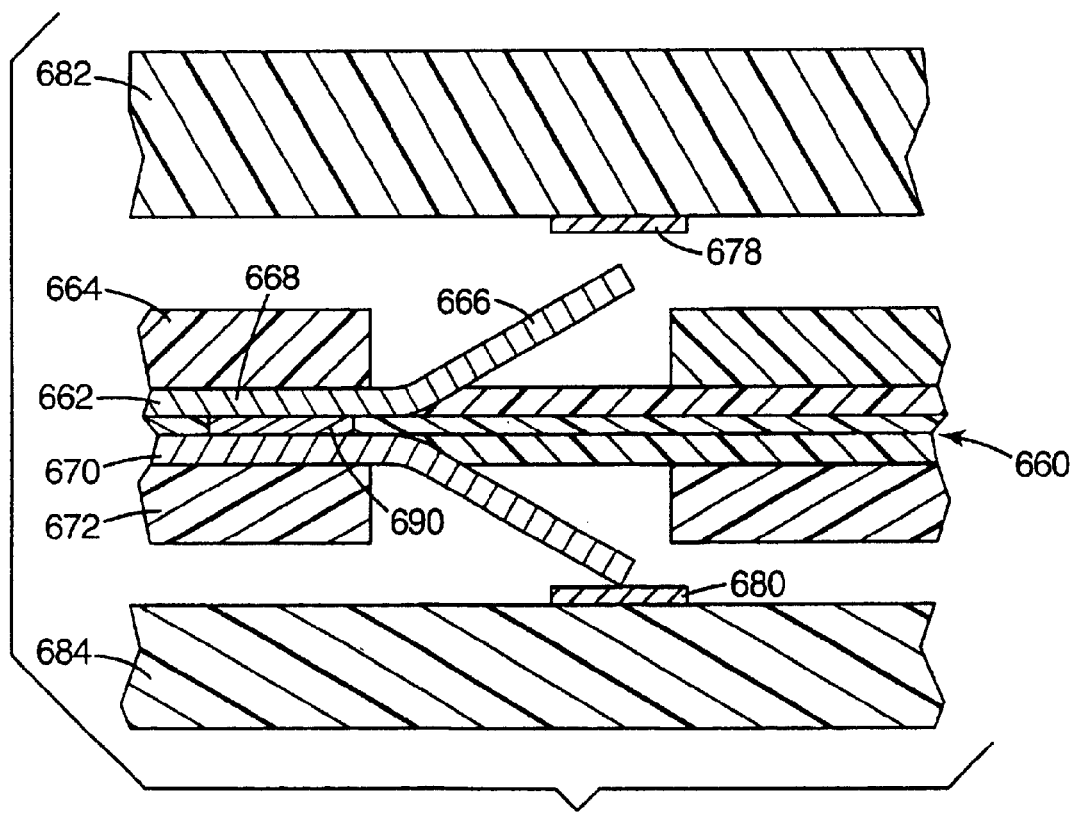
FIG. 24 is a side sectional view of an alternate compliant interconnect assembly using a pair of the flexible circuit members, such as illustrated in FIGS. 10D-10I, in a back to back configuration.

FIGS. 23 and 24 illustrate a compliant interconnect assembly 660 with a first electrical trace 662 attached to carrier 664. The first electrical trace 662 is singulated and the distal ends 666 of the compliant members 668 are deformed. Similarly, a second electrical trace 670 is attached to a carrier 672, singulated and the distal ends 674 of the compliant members 676 deformed. The electrical traces 662, 670 are placed in a back to back configuration so that the respective compliant members 668, 676 are electrically coupled.

In the embodiment of FIG. 23, the compliant members 668, 674 include holes 686, 688 that can be electrically coupled using a mechanical connection such as a conductive plug or rivet, a heat stake, spot or ultrasonic welding, solder, compression, a coined feature that flattens against the opposing compliant member, electrical plating, or a variety of other methods.

In the embodiment of FIG. 24, the compliant members 668, 676 are electrically coupled by melting solder 690 between the joint, using the carriers 664, 672 as a solder mask to prevent solder from wicking up the distal ends 666, 674. Alternatively, the compliant members 668, 676 can be electrically coupled using compression, solder paste, conductive adhesive, spot or ultrasonic welding, a coined feature that flattens against the opposing compliant member, or a variety of other techniques. In one embodiment, The distal ends 666, 674 are electrically coupled with contact pads 678, 680 on respective first and second circuit members 682, 684, as discussed in connection with FIGS. 21 and 22.

Figure 25:
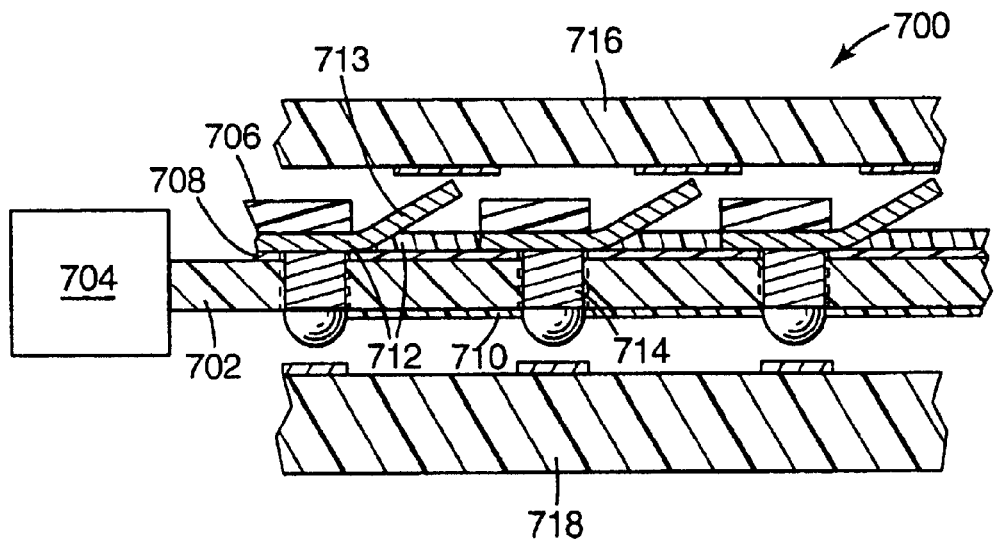
FIG. 25 illustrates an alternate compliant interconnect assembly generally as illustrated in FIG. 21 with an additional circuitry plane is added to the structure.

FIG. 25 illustrates an alternate compliant interconnect assembly 700 generally as illustrated in FIG. 21, except that an additional circuitry plane 702 is added to the structure. For example, the circuitry plane 702 can be a power plane, a ground plane, or a connection to an external integrated circuit device 704. The circuitry plane 702 is preferably electrically isolated between carriers 708, 710, although some of the compliant members 713 can be electrically coupled to the circuitry plane 702. Optional carrier 706 can be provided. In the illustrated embodiment, the circuitry plane 702 extends beyond the boundaries of the compliant interconnect assembly 700 to facilitate connection to a power source, a ground plane, or an external devices 704. For example, the compliant interconnect assembly 700 can be inserted into the replaceable chip module 400 of FIG. 16, electrically coupling the circuitry plane 702 to the flexible circuit member 454 or the edge card connector 452.

As discussed in connection with FIG. 10E, a portion of the electrical trace 712 can serve as a ground plane or power plane in some embodiments. The present compliant interconnect assembly 700 provides for internal or embedded passive features such as decoupling capacitance as a result of the layered power plane 702 and the ground plane provided by a portion of the electrical trace 712. In yet another embodiment, discrete electrical components 714, such as capacitors, can be added to the present compliant interconnect assembly 700. The circuitry plane 702 of the present embodiment improves the operating performance of the first and second circuit members 716, 718.

Figure 26:
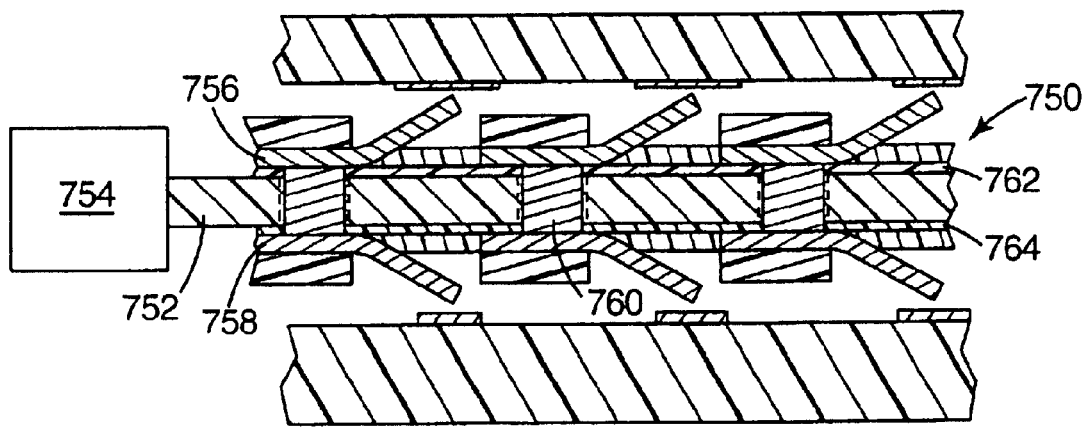
FIG. 26 illustrates an alternate compliant interconnect assembly generally as illustrated in FIG. 24 with an additional circuitry plane is added to the structure.

FIG. 26 illustrates an alternate compliant interconnect assembly 750 generally as illustrated in FIGS. 23 and 24, except that an additional circuitry plane 752 is added to the structure. Again, the circuitry plane 752 can be a power plane, a ground plane, or a connection to an external integrated circuit device 754. The circuitry plane 752 preferably extends beyond the boundaries of the compliant interconnect assembly 750 to facilitate connection to a power source or external devices 754. The circuitry plane 752 is preferably electrically isolated between dielectric layers 762, 764. The present compliant interconnect assembly 750 provides for internal or embedded passive features such as decoupling capacitance as a result of the layered power plane 752 and the ground plane provided by a portion of the electrical traces 756, 758. Discrete electrical components 760, such as capacitors, can optionally be added to the present compliant interconnect assembly 750.

Figure 27:
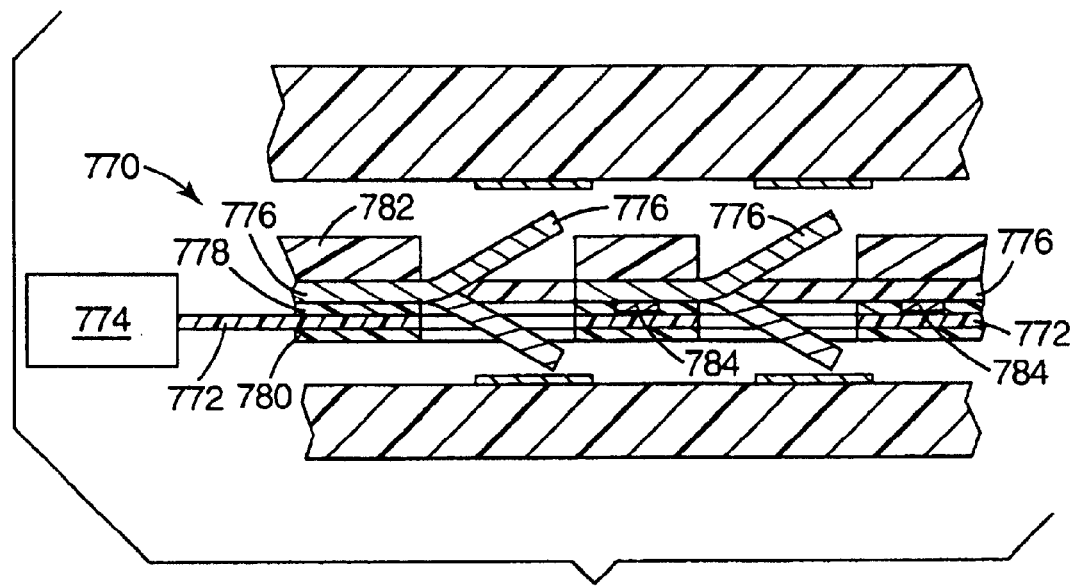
FIG. 27 illustrates an alternate compliant interconnect assembly generally as illustrated in FIG. 21 with an additional circuitry plane is added to the structure.

FIG. 27 illustrates an alternate compliant interconnect assembly 770 generally as illustrated in FIG. 22, except that an additional circuitry plane 772 is added to the structure. Again, the circuitry plane 772 can be a power plane or a connection to an external integrated circuit device 774. The circuitry plane 772 preferably extends beyond the boundaries of the compliant interconnect assembly 770 to facilitate connection to a power source or external devices 774. The present compliant interconnect assembly 770 provides for internal or embedded passive features such as decoupling capacitance as a result of the layered power plane 772 and the ground plane provided by a portion of the electrical traces 776 attached to carrier 782. The circuitry plane 772 is preferably sandwiched between layers of dielectric material 778, 780. Discrete electrical components 784, such as capacitors, can optionally be added to the present compliant interconnect assembly 770.

FIGS. 28A-28D illustrate various aspects of an alternate compliant interconnect assembly 800 in accordance with the present invention. As discussed in connection with FIGS. 21-27, the flexible circuit member is preferably attached to a carrier before singulation so to retain the spatial relationship of the compliant members (see FIGS. 10D-10I). In the embodiment of FIGS. 28A-28D, the flexible circuit member, which is typically a sheet of conductive material, is singulated prior to attachment to carrier 806 to form a plurality of discrete compliant members 804. The discrete compliant members 804 are attached to a carrier 806 using a variety of techniques, such as thermal or ultrasonic bonding, adhesives, mechanical attachment, and the like.

In the illustrated embodiment, the carrier 806 includes pairs of adjacent slots 808, 810. Center portion 812 of the carrier 806 between the slots 808, 810 acts as a torsion bar. A discrete compliant member 804 is inserted though the slot 808 and attached to the center portion 812, preferably by crimping. Alternatively, the compliant members 804 can be attached to the carrier 806 through single slot 814. Upper and lower dielectric layers 816, 818 are preferably added to the top and bottom of the compliant interconnect assembly to prevent shorting or contact rollover during compression. An additional circuitry plane 820 and dielectric covering layer 822, as discussed above, can also be added to the present compliant interconnect assembly 800.

Figure 28A:
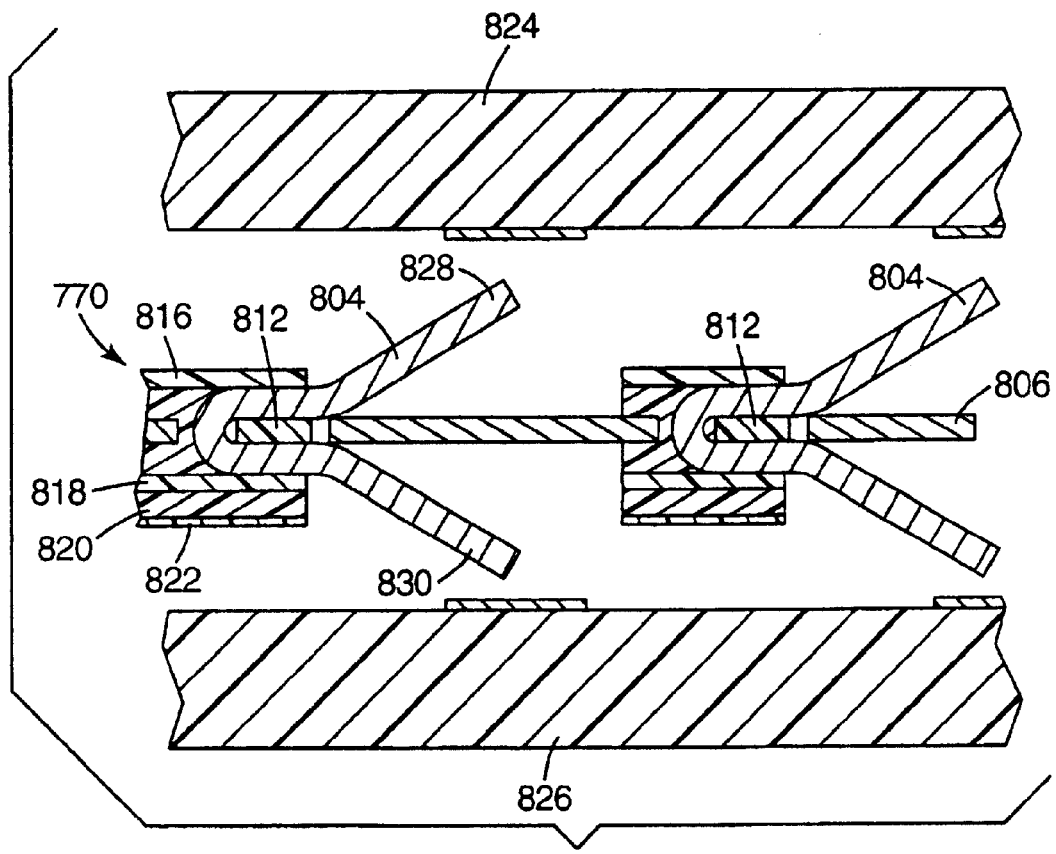
FIGS. 28A-28D illustrate an alternate compliant interconnect assembly constructed with a plurality of discrete compliant members.
Figure 28B:
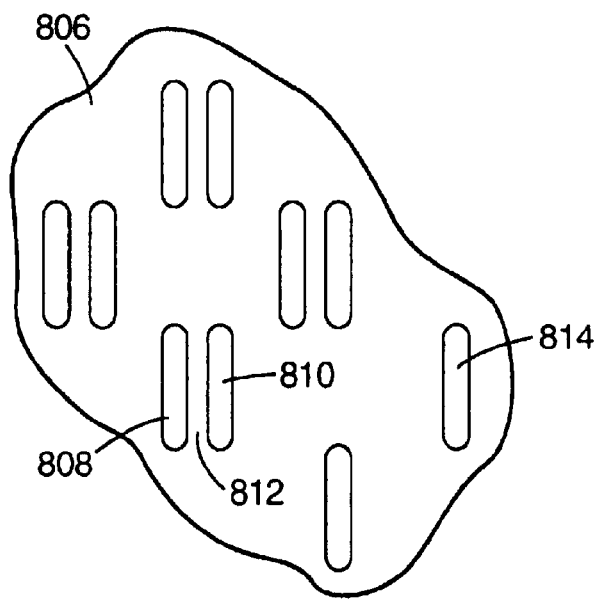
Figure 28C:
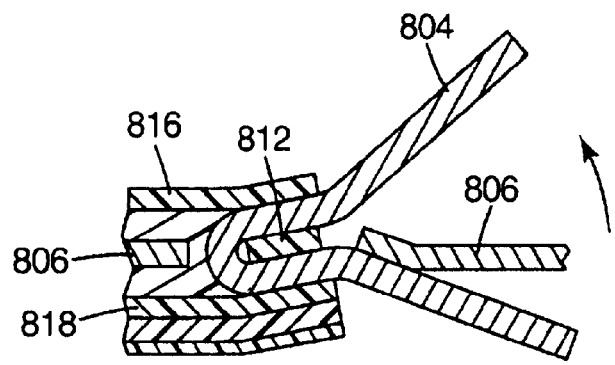
Figure 28D:
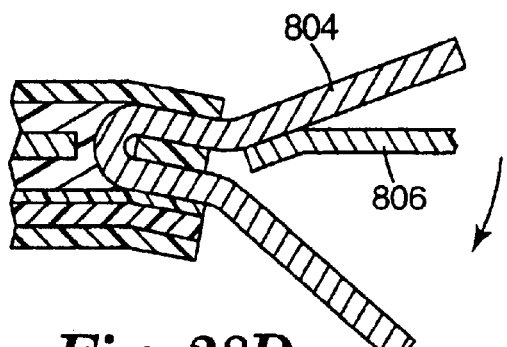

As best illustrated in FIGS. 28C and 28D, the center portion 812 twists and/or deforms to permit the compliant members 804 to compensate for non-planarity in the first and second circuit members 824, 826 (see FIG. 28a). Distal ends 828, 830 of the compliant members 804 also flex when compressed by the first and second circuit members 824, 826. The amount of displacement and the resistance to displacement can be adjusted by changing the size and shape of the center portion 812 on the carrier 806, and/or by constructing the carrier 806 from a more rigid or less rigid material that resists displacement of the compliant members 804. In one embodiment, a flexible circuit member, such as shown in FIGS. 10D-10I is attached to the carrier 806. The combination of the flexible circuit member and the discrete compliant members provides maximum flexibility in constructing the present compliant interconnect assembly 800.

Figure 29:
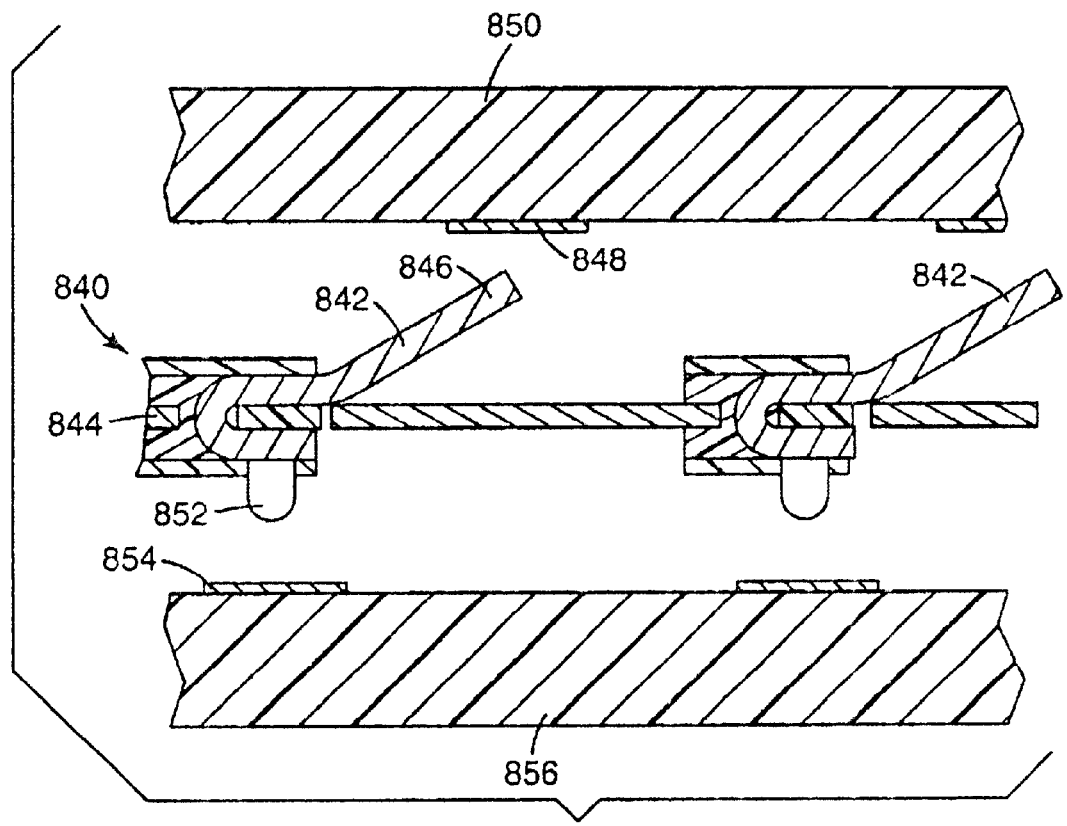
FIG. 29 illustrate a variation of the compliant interconnect assembly of FIG. 28A.

FIG. 29 illustrates a variation of the compliant interconnect assembly 800 of FIGS. 28A-28D. The compliant interconnect assembly 840 includes a plurality of discrete compliant members 842 attached to a carrier 844 as discussed above. Distal end 846 is positioned to electrically couple with contact pad 848 on first circuit member 850. Solder ball 852 replaces the distal end 830 in FIG. 28A. The solder ball 852 is positioned to electrically couple with contact pad 854 on second circuit member 856.

Figure 30:
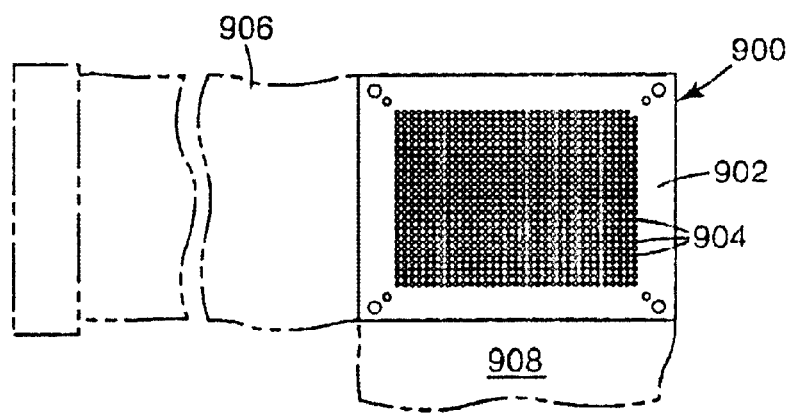
FIG. 30 is a top view of a compliant interconnect assembly generally as illustrated in FIGS. 21-29.

FIG. 30 is a top view of a compliant interconnect assembly 900 as shown in FIGS. 21-29. Carrier 902 includes an array of holes 904 through which distal ends of the compliant members extend to engage with circuit members (see FIGS. 21-29). Any additional circuit planes (see FIGS. 25-26) are preferably ported from the side of the compliant interconnect assembly 900, preferably by flexible circuit members 906, 908.

The embodiments disclosed herein are basic guidelines, and are not to be considered exhaustive or indicative of the only methods of practicing the present invention. There are many styles and combinations of properties possible, with only a few illustrated. Each connector application must be defined with respect to deflection, use, cost, force, assembly, & tooling considered.

Patents and patent applications disclosed herein, including those cited in the background of the invention, are hereby incorporated by reference. Other embodiments of the invention are possible. It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A compliant interconnect assembly comprising:
   a first dielectric layer having a first major surface and a plurality of through openings;
   a first flexible circuit member comprising a plurality of electrical traces having a first major surface attached to the first major surface of the first dielectric layer and a plurality of conductive compliant members attached to the first flexible circuit member and having a plurality of first distal ends aligned with a plurality of the openings of the first dielectric layer; and
   a second dielectric layer having a first major surface positioned opposite a second major surface of the first flexible circuit member, the second dielectric layer having a plurality of through openings aligned with second distal ends of a plurality of conductive compliant members.

2. The compliant interconnect assembly of claim 1 wherein the distal end is deformed to project through an opening in the first dielectric layer.

3. The compliant interconnect assembly of claim 1 wherein the distal end extends above a second major surface of the first dielectric layer.

4. The compliant interconnect assembly of claim 1 wherein the distal end comprises two distal ends.

5. The compliant interconnect assembly of claim 1 wherein the distal end comprises a curvilinear shape.

6. The compliant interconnect assembly of claim 1 wherein the distal end comprises a first distal end deformed to project in an opening in the first dielectric layer and a second distal end deformed to project in an opening in the second dielectric layer.

7. The compliant interconnect assembly of claim 1 comprising a first circuit member having contact pads aligned with, and electrically coupled to, the distal ends of the conductive compliant members.

8. The compliant interconnect assembly of claim 7 wherein the first circuit member comprises one of a printed circuit board, a flexible circuit, a bare die device, an integrated circuit device, organic or inorganic substrates, or a rigid circuit.

9. The compliant interconnect assembly of claim 1 comprising a second circuit member having contact pads aligned with the holes in the second dielectric layer, the second circuit member being electrically coupled to the conductive compliant members through the holes in the second dielectric layer.

10. The compliant interconnect assembly of claim 1 comprising an additional circuitry plane attached to a second major surface of the second dielectric layer, the additional circuitry plane comprising a plurality of through openings aligned with a plurality through openings in the second dielectric layer.

11. The compliant interconnect assembly of claim 1 comprising one or more discrete electrical components electrically coupled to the first flexible circuit member.

12. The compliant interconnect assembly of claim 1 comprising:
   a second flexible circuit member comprising a plurality of electrical traces having a first major surface attached to the first major surface of the second dielectric layer and, the electrical trace comprising a plurality of conductive compliant members having at least one distal end projecting in one of the openings of the second dielectric layer; and
   an electrical connection between the conductive compliant members on the first flexible circuit member and the conductive compliant members on the second flexible circuit member.

13. The compliant interconnect assembly of claim 1 wherein a portion of the first flexible circuit member extends beyond the compliant interconnect assembly to permit electrical coupling with another circuit member.

14. The compliant interconnect assembly of claim 1 wherein the electrical traces are singulated so that a portion of the conductive compliant members are electrically isolated from the electrical traces.

15. The compliant interconnect assembly of claim 1 wherein a portion of the conductive compliant members are electrically coupled to form a ground plane or a power plane.

16. The compliant interconnect assembly of claim 1 wherein the distal ends of the conductive compliant members are adapted to engage with a connector member selected from the group consisting of a flexible circuit, a ribbon connector, a cable, a printed circuit board, a ball grid array (BGA), a land grid array (LGA), a plastic leaded chip carrier (PLCC), a pin grid array (PGA), a small outline integrated circuit (SQIC), a dual in-line package (DIP), a quad flat package (QFP), a leadless chip carrier (LCC), a chip scale package (CSP), or packaged or unpackaged integrated circuits.

17. The compliant interconnect assembly of claim 1 wherein the second dielectric layer is attached to a printed circuit board and a plurality of the conductive compliant members are electrically coupled to contact pads on the printed circuit board through the openings in the second dielectric layer.

18. The compliant interconnect assembly of claim 1 wherein a portion of the first flexible circuit member extends beyond the compliant interconnect assembly to form a stacked configuration other compliant interconnect assemblies.

19. The compliant interconnect assembly of claim 1 wherein the dielectric layer comprises a rigid material.

20. The compliant interconnect assembly of claim 1 wherein the dielectric layer comprises a flexible material.

21. The compliant interconnect assembly of claim 1 wherein the conductive compliant member are crimped to the first flexible circuit member.

22. The compliant interconnect assembly of claim 1 comprising solder balls electrically coupled to the conductive compliant members and projecting away from a second major surface of the first flexible circuit member.

23. The compliant interconnect assembly of claim 9 wherein the second circuit member is electrically coupled to the conductive compliant members by solder.

24. The compliant interconnect assembly of claim 9 wherein a distal end of a conductive compliant member extends through the holes in the second dielectric layer to electrically couple with the second circuit member.

25. The compliant interconnect assembly of claim 10 wherein the additional circuitry plane comprises one of a ground plane, a power plane, or an electrical connection to other circuit members.

26. The compliant interconnect assembly of claim 11 wherein the one or more discrete electrical components comprise capacitors.

27. The compliant interconnect assembly of claim 12 comprising a dielectric layer located between the first and second flexible circuit members.

28. The compliant interconnect assembly of claim 12 wherein the electrical connection comprises solder.

29. The compliant interconnect assembly of claim 12 wherein the electrical connection comprises a compressive relationship between the conductive compliant members on the first and second flexible circuit members.

30. The compliant interconnect assembly of claim 12 wherein the electrical connection comprises a conductive adhesive.

31. The compliant interconnect assembly of claim 12 comprising an additional circuitry plane interposed between the first and second flexible circuit members.

32. The compliant interconnect assembly of claim 31 wherein at least one major surface of the additional circuitry plane comprises a dielectric layer.

33. The compliant interconnect assembly of claim 12 comprising a second circuit member having contact pads aligned with, and electrically coupled to, the distal ends of the conductive compliant members on the second flexible circuit member.

34. The compliant interconnect assembly of claim 33 wherein the second circuit member comprises a bare die device.

35. A compliant interconnect assembly comprising:
   a first flexible circuit member having a first major surface and a plurality of through openings;
   at least one discrete conductive compliant member extending through one of the openings in the first flexible circuit member and attached to the first flexible circuit member, the conductive compliant member having at least one distal end projecting away from the first flexible circuit member;
   a dielectric layer having a first major surface positioned opposite the first major surface of the first flexible circuit member, the dielectric layer having a plurality of openings through which a plurality of the distal ends of the conductive compliant members extend; and
   a second dielectric layer having a first major surface positioned opposite a second major surface of the first flexible circuit member, the second dielectric layer having a plurality of openings aligned with a plurality of the conductive compliant members.

36. The compliant interconnect assembly of claim 35 comprising plurality of electrical traces attached to the first major surface of the first flexible circuit member.

37. The compliant interconnect assembly of claim 35 wherein the conductive compliant members comprise two distal ends projecting away from opposite sides of the first flexible circuit member.

38. The compliant interconnect assembly of claim 35 comprising solder balls electrically coupled to the conductive compliant members and projecting away from a second major surface of the first flexible circuit member.

39. The compliant interconnect assembly of claim 35 wherein the conductive compliant member are crimped to the first flexible circuit member.

40. The compliant interconnect assembly of claim 35 comprising plurality of electrical traces attached to the first major surface of the first flexible circuit member and electrically coupled to at least one of the conductive compliant members.

41. The compliant interconnect assembly of claim 35 comprising a first circuit member having contact pads aligned with, and electrically coupled to, the distal ends of the conductive compliant members.

42. The compliant interconnect assembly of claim 35 comprising a second circuit member having contact pads electrically coupled to the conductive compliant members.

43. The compliant interconnect assembly of claim 35 comprising one or more discrete electrical components electrically coupled to the first flexible circuit member.

44. The compliant interconnect assembly of claim 41 wherein the first circuit member comprises one of a printed circuit board, a flexible circuit, a bare die device, an integrated circuit device, organic or inorganic substrates, or a rigid circuit.

45. The compliant interconnect assembly of claim 35 comprising an additional circuitry plane attached to a the compliant interconnect assembly.

46. The compliant interconnect assembly of claim 45 wherein the additional circuitry plane comprises one of a ground plane, a power plane, or an electrical connection to other circuit members.

47. The compliant interconnect assembly of claim 43 wherein the one or more discrete electrical components comprise capacitors.

* * * * *

UNITED STATES PATENT AND TRADEMARK OFFICE
CERTIFICATE OF CORRECTION

PATENT NO. : 6,957,963 B2
DATED : October 25, 2005
INVENTOR(S) : James J. Rathburn It is certified that error appears in the above-identified patent and that said Letters Patent is hereby corrected as shown below:

Column 21,
Line 44, delete "(SQIC)" and replace with -- (SOIC) --.

Signed and Sealed this

Twenty-eighth Day of March, 2006

JON W. DUDAS
*Director of the United States Patent and Trademark Office*